(12) United States Patent
Kariya et al.

(10) Patent No.: US 7,656,032 B2
(45) Date of Patent: Feb. 2, 2010

(54) SEMICONDUCTOR CHIP MOUNTING WIRING BOARD, MANUFACTURING METHOD FOR SAME, AND SEMICONDUCTOR MODULE

(75) Inventors: Takashi Kariya, Gifu (JP); Masaya Nishikawa, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 499 days.

(21) Appl. No.: 11/280,248

(22) Filed: Nov. 17, 2005

(65) Prior Publication Data

US 2006/0076671 A1    Apr. 13, 2006

Related U.S. Application Data

(62) Division of application No. 10/344,892, filed as application No. PCT/JP02/00973 on Feb. 6, 2002, now Pat. No. 7,049,528.

(51) Int. Cl.
*H01L 23/48* (2006.01)
*H01L 23/52* (2006.01)
*H01L 29/40* (2006.01)

(52) U.S. Cl. .............................. 257/734; 257/E23.036
(58) Field of Classification Search ................ 174/255; 257/668, 734, E23.036, E21.524
See application file for complete search history.

(56) References Cited

U.S. PATENT DOCUMENTS

| 4,541,895 | A |   | 9/1985 | Albert |       |
| 4,571,359 | A |   | 2/1986 | Dutt   |       |
| 5,754,621 | A | * | 5/1998 | Suzuki et al. | 378/57 |

(Continued)

FOREIGN PATENT DOCUMENTS

JP        9-219490       8/1997

(Continued)

OTHER PUBLICATIONS

English Language Abstract of JP 10/256429.

(Continued)

*Primary Examiner*—Leonardo Andújar
*Assistant Examiner*—Monica D Harrison
(74) *Attorney, Agent, or Firm*—Greenblum & Bernstein, P.L.C.

(57) ABSTRACT

A semiconductor chip mounting wiring board 2 includes an insulating resin substrate 5, a first conductive bump 12 formed on one side of the insulative resin substrate 5 to mount a semiconductor chip 3, a wiring pattern 15 extending from the first conductive bump 12 toward the periphery of the insulating resin substrate 5, a filled viahole 9 leading from the other side of the insulating resin substrate 5 to the wiring pattern 15, and a second conductive bump 13, or a conductive pad 19, positioned just above the filled viahole 9 and electrically connected to the viahole 9.

A semiconductor module is produced by mounting the semiconductor chip 3 in advance on the first conductive bump 12 on the semiconductor chip mounting wiring board 2 and stacking a plurality of the wiring boards 2 and interlayer members 20 each having an opening 27 to receive the semiconductor chip 3 and a conductive post 26 or conductive pad connected to the second conductive bump 13 of the wiring board 2 alternately on each other with an adhesive applied between them, placing another interconnecting circuit board such as an I/O wiring board 30 or the like on an outermost layer, and by applying hot-pressing to the stack. The semiconductor module thus produced has a high connection reliability and can be designed for a high mounting density and a lower profile.

22 Claims, 22 Drawing Sheets

U.S. PATENT DOCUMENTS

| | | | |
|---|---|---|---|
| 6,108,903 A | 8/2000 | Nakatani et al. | |
| 6,376,769 B1 | 4/2002 | Chung | |
| 6,376,906 B1 * | 4/2002 | Asai et al. | 257/698 |
| 6,534,723 B1 * | 3/2003 | Asai et al. | 174/255 |
| 6,613,605 B2 * | 9/2003 | Pace | 438/106 |
| 6,698,093 B2 | 3/2004 | Nishii | |

FOREIGN PATENT DOCUMENTS

| | | |
|---|---|---|
| JP | 09-289264 | 11/1997 |
| JP | 10-135267 | 5/1998 |
| JP | 10-163414 | 6/1998 |
| JP | 10-256429 | 9/1998 |
| JP | 11-145381 | 5/1999 |
| JP | 2000-208698 | 7/2000 |
| JP | 2001-068624 | 3/2001 |
| JP | 2001-085603 | 3/2001 |
| JP | 2001-144218 | 5/2001 |
| JP | 2001-244365 | 9/2001 |
| JP | 2001-267490 | 9/2001 |
| JP | 2001-298115 | 10/2001 |
| JP | 2002-009227 | 1/2002 |
| JP | 2002-016169 | 1/2002 |
| JP | 2002-026244 | 1/2002 |
| JP | 2003-500832 | 1/2003 |
| JP | 2003-218273 | 7/2003 |
| WO | 0070676 | 11/2000 |
| WO | 2004/045834 | 6/2004 |
| WO | 97/30604 | 8/2004 |

OTHER PUBLICATIONS

English Language Abstract of JP 9-219490.
English Language Abstract of JP 10-135267.
English Language Abstract of JP 10-163414.
English Language Abstract of JP 2002-016169.
English Language Abstract of JP 2001-085603.
English Language Abstract of JP 2001-068624.
English Language Abstract of JP 2001-244365.
English Language Abstract of JP 2001-267490.
English Language Abstract of JP 2001-298115.
English Language Abstract of JP 2002-026244.
English Language Abstract of JP 11-145381 published on May 28, 1999.
English Language Abstract of JP 2001-144218 published on May 25, 2001.
English Language Abstract of JP 2002-9227 published on Jan. 11, 2002.
English Language Abstract of JP 2000-208698 published on Jul. 28, 2000.
English Language Abstract of JP 09-289264 published on Nov. 4, 1997.
English Language Abstract of JP 2003-218273 published on Jul. 31, 2003.

* cited by examiner (A)

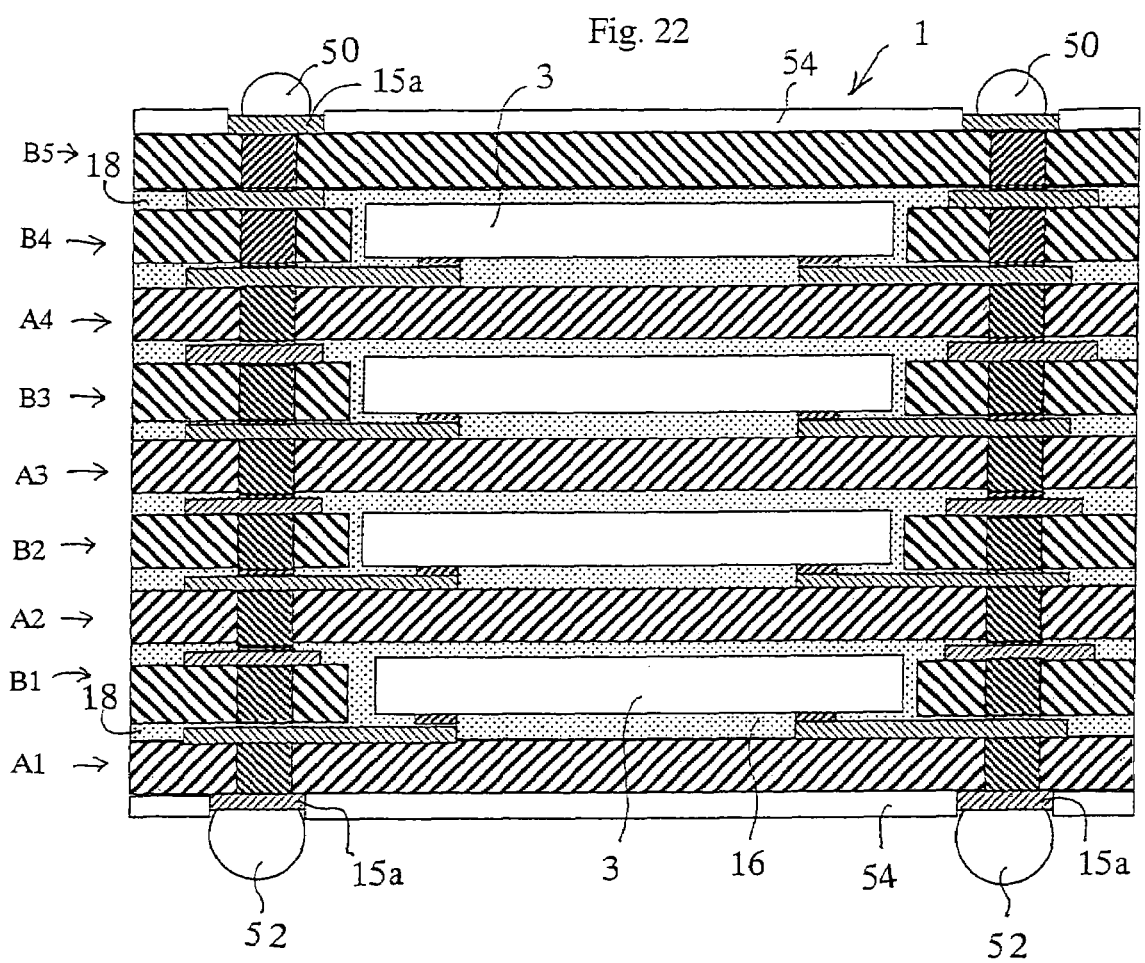

US 7,656,032 B2

SEMICONDUCTOR CHIP MOUNTING WIRING BOARD, MANUFACTURING METHOD FOR SAME, AND SEMICONDUCTOR MODULE

CROSS-REFERENCE TO RELATED APPLICATIONS

This application is a divisional of application Ser. No. 10/344,892, filed Feb. 25, 2003 now U.S. Pat. No. 7,049,528 which is a National Stage Application of International Application No. PCT/JP02/00973, filed Feb. 6, 2002, which was not published in English under PCT Article 21(2), entering the National Stage on Feb. 25, 2003. The entire disclosure of application Ser. No. 10/344,892 is considered as being part of this application, and the entire disclosure of application Ser. No. 10/344,892 is expressly incorporated by reference herein in its entirety.

FIELD OF THE INVENTION

The present invention relates to a wiring board suitable for mounting semiconductor chips such as IC chip and the like on a wiring pattern provided on an insulating resin substrate, a method of manufacturing the wiring board, and a semiconductor module formed by stacking wiring boards having semiconductor chips mounted thereon and interlayer members alternately on each other.

BACKGROUND ART

To meet the demands for improved mounting densities and functionality of printed wiring boards, techniques have recently been proposed to bury each of semiconductor chips in a substrate.

As one typical example of such techniques, a package having each semiconductor chip buried in a ceramic substrate is known from the disclosure in JP H10-256429 A. The package has a BGA (ball grid array) structure in which a semiconductor chip is buried in a concavity formed in the ceramic substrate and connected to a conductive circuit formed in the ceramic substrate by the flip-chip bonding, thereby improving the heat dissipation from the semiconductor chip and allowing a narrower pitch of wiring.

However, in the above package wiring board produced by the conventional technique, wires for electrical connection of the semiconductor chip to outside are led out solely from the wiring board. So, wiring boards of this type cannot easily be stacked on each other. Even if they are stacked on each other, it is very difficult to connect the wires led out of the semiconductor chips to the stack of the wiring boards because the wiring board having the semiconductor chip buried in the substrate thereof is basically different in structure from the wiring board to be stacked on the former wiring board.

The ceramic substrate having a semiconductor chip buried therein using the conventional technique is used as a package wiring board and connected at semiconductor chip-side terminals thereof formed at a fine pitch to a printed wiring board. The led-out wire is electrically connected with a solder ball (BGA) or pin (PGA) to an external wiring board. Therefore, it has not been conceived that such wiring boards are to be stacked on each other, and the ceramic substrate is not so constructed that a plurality thereof can be stacked on each other to stack the semiconductor chips buried therein on each other.

Therefore, even if such ceramic substrates are stacked on each other, they are likely to be delaminated from each other, which causes the electrical connection and reliability of the wiring boards to be poor.

Also, techniques for producing a semiconductor module in which IC chips are stacked together are disclosed in JP H9-219490 A, JP H10-135267 A, and JP H10-163414 A, for example. These conventional techniques are intended to meet the requirement for a higher mounting density of the IC chips.

With the above conventional techniques, each IC package such as TSOP (thin small outline package), TCP (tape carrier package), BGA (ball grid array) package or the like is assembled and then a plurality of such IC packages is stacked on each other. The IC packages are connected to each other with external-connection terminals provided beforehand on each of them. These conventional techniques need many manufacturing steps, which adds to the processing costs.

Referring now to FIGS. 1 and 2, there is schematically illustrated a stack of IC packages produced by the aforementioned conventional techniques. FIG. 1 shows a stack of IC packages molded from a resin, and FIG. 2(a) is a side elevation, and FIG. 2(b) is a plan view, of a module wiring board on which the IC package stack in FIG. 1 is mounted thereon.

As shown, each of IC package 100A and 100B includes an IC mount 106, IC chip 102 mounted on the top of the IC mount 106, lead 101 for connecting the IC chip 102 and an external part to each other, and a bonding wire 103 for connecting the IC chip 102 and lead 101 to each other in a resin 104 which encapsulates a predetermined range around the IC chip 102.

The IC package 100B is piggybacked on the IC package 100A, and this stack of the 100A and 100B is mounted on a printed wiring board 105.

However, when the above IC packages 100A and 100B are piggybacked on each other in the direction of their thickness and the stack is mounted on the printed wiring board 105, the thickness of the resin 104 will increase total module thickness.

Also, when each of the IC packages 100A and 100B is mounted horizontally on the printed wiring board 105, the semiconductor module as a whole will be larger in size.

Further, since the IC packages 100A and 100B, upper and lower in relation to each other, are connected with the leads 101 to the printed wiring board 105, respectively, if they are stacked on each other with a misalignment or misregistration, a short-circuit is likely to take place between the leads 101.

Thus, the application of the aforementioned conventional techniques to the IC packages used in electronic devices required to be smaller in size such as IC cards, mobile telephones, etc. cannot be a solution to the problems of mounting density and low profile of the IC package.

Accordingly, the present invention has an object to overcome the above-mentioned drawbacks of the prior art by providing a semiconductor chip mounting wiring board which can positively be connected to the semiconductor chips and in which wires led out from the semiconductor chips can further be stacked.

The present invention has another object to provide a method of producing a semiconductor chip mounting wiring board whose connection is highly reliable.

The present invention has still another object to provide a semiconductor module made by stacking wiring boards each having a semiconductor chip mounted thereon and interlayer members alternately on each other and applying hot-pressing to them, and which has a high connection reliability and can be designed for a higher mounting density and lower profile.

To attain the above objects, the inventors of the present invention found, through many experiments, the fact that by stacking wiring boards each having a semiconductor chip mounted beforehand on a wiring board and interlayer members each having an opening to receive the semiconductor chip alternately on each other with an adhesive layer applied between them, applying hot-pressing to the thus formed stack, instead of molding semiconductor chips in a resin as in the prior art, to bury the semiconductor chip in the opening in the interlayer member, and electrically connecting the semiconductor chips to each other via a viahole or conductor post formed in the interlayer member, the distance between the semiconductor chips can be reduced and troubles caused by wire resistance and inductance can be minimized so that electric information can be transmitted at a high speed without any delay, and the mounting density, functionality and profile of the printed wiring board can be improved.

DISCLOSURE OF THE INVENTION (1) The above object can be attained by providing a semiconductor chip mounting wiring board including, according to the present invention, an insulating resin substrate having provided nearly in the center on one side thereof a semiconductor chip mounting area, a first conductive bump formed in the semiconductor mounting area, a wiring pattern extending from the first conductive bump toward the periphery of the insulating resin substrate, a viahole formed, on the other side of the insulating resin substrate, from a conductive substance filled in an opening leading to the wiring pattern, and a second conductive bump electrically connected to the viahole and projecting from the other side of the insulating resin substrate.

(2) Also the above object can be attained by providing a semiconductor chip mounting wiring board including, according to the present invention, an insulating resin substrate, a conductive bump provided nearly in the center on one side of the insulating resin substrate to mount a semiconductor chip, a wiring pattern extending from the conductive bump toward the periphery of the insulating resin substrate, a viahole formed, on the other side of the insulating resin substrate, from a conductive substance filled in an opening leading to the wiring pattern, and a conductive pad electrically connected to the viahole.

In the semiconductor chip mounting wiring boards set forth in (1) and (2), a part of the wiring pattern should desirably be shaped in the form of a conductive pad. Particularly, it should preferably be formed in the position of the viahole provided at the periphery of the wiring board to increase the area of contact of the stacked interlayer members with the conductive bump in order to compensate for any misregistration occurred during stacking.

In the semiconductor chip mounting wiring board set forth in (2), the wiring pattern should preferably be formed not only on the one side of the insulating resin substrate but on the other side and electrically connected to the conductive pad positioned just above the viahole. That is, the wiring pattern should desirably be formed on either side of the insulating resin substrate.

Also, in the semiconductor chip mounting wiring board set forth in (1) and (2), the viahole should desirably be formed from at least a metal selected from Cu, Sn, Pb, Ag, Au, Zn, In, Bi, solder and tin alloy.

Also, in case the wiring pattern is formed on both sides of the insulating resin substrate, the viahole should desirably be formed from a metal containing at least a metal whose melting point is lower than that of copper, and it should preferably be formed to have two layers, one being formed by applying a plating of electrolytic copper filled near the bottom of the opening for forming the viahole and the other being formed by electrolytic plating of a metal whose melting point is lower than copper, filled near the top end of the opening.

Further, the viahole should desirably be formed by electrolytic or electroless plating, and more preferably be formed by electrolytic plating.

Furthermore, in the semiconductor chip mounting wiring boards set forth in (1) and (2), the conductive bump should desirably be formed from at least a metal selected from Cu, Sn, Pb, Ag, Au, Zn, In, Bi, solder and tin alloy and which is electroless-plated.

Particularly, the conductive bump should preferably be formed by coating electrolytic tin or solder plating.

Also, the first conductive bump provided for mounting the semiconductor chip and second conductive bump for connection with the interlayer members may be formed from the same metal or from metals of different melting points, respectively. Particularly, the first conductive bump should desirably be formed from a metal whose melting point is lower than that of a metal from which the second conductive bump is formed, and more preferably the melting points of the first and second conductive bumps should be within a range of 150 to 240° C.

In the semiconductor chip mounting wiring board set forth in (1), there should desirably be formed an adhesive layer on the other side of the insulating resin layer. The adhesive should preferably be at least one resin selected from epoxy resin, polyimide resin, thermo-setting polyphenylene ether, composite resin of epoxy resin and thermo-setting resin, composite resin of epoxy resin and silicon resin, and BT resin.

In the above semiconductor chip mounting wiring boards, a matted layer should desirably be formed on the wiring pattern surface.

(3) Also the above object can be attained by providing a method of producing a semiconductor chip mounting wiring board including an insulating resin substrate having a wiring pattern formed on one side thereof a wiring pattern, a first conductive bump formed on the wiring pattern to mount a semiconductor chip to be disposed nearly in the center of the insulating resin substrate, a viahole formed from a conductive material filled in an opening leading from the other side of the insulating resin substrate to the wiring pattern, and a second conductive bump provided on the viahole, the method including, according to the present invention, at least the following six steps of:

(a) attaching a light-transparent resin layer on the other side of the insulating resin substrate having a copper foil attached on the one side thereof, irradiating the other side of the insulating resin substrate with a laser beam from above the resin layer to form an opening leading to the copper foil, and cleaning the opening inside by removing the remaining resin;

(b) applying an electrolytic plating to the insulating resin substrate covered with a protective layer to fill an electrolytic plating metal in the opening in order to form a filled viahole;

(c) coating the insulating resin substrate processed in the above step (b) with a further electrolytic plating metal to form the second conductive bump from the electrolytic plating metal just above the filled viahole;

(d) separating the protective layer and resin layer from the insulating resin substrate, then attaching a protective layer to the other side of the insulating resin substrate, and forming nearly in the center on the one side of the insulating resin substrate a plating photoresist layer having an opening corresponding to the position of a terminal of the semiconductor chip to be mounted;

(e) applying an electrolytic plating to the insulating resin substrate processed in the step (d) above to fill an electrolytic plating metal in the opening in order to form the first conductive bump corresponding to the position of the terminal of the semiconductor chip to be mounted; and (f) removing the plating photoresist layer, then forming an etching photoresist layer corresponding to a predetermined wiring pattern extending from the first conductive bump toward the periphery of the insulating resin layer, and removing, by etching, a copper foil portion where the etching photoresist layer is not formed to form the predetermined wiring pattern.

(4) Also the above object can be attained by providing a method of producing a semiconductor chip mounting wiring board including an insulating resin substrate having a wiring pattern formed on one side thereof a wiring pattern, a first conductive bump formed on the wiring pattern to mount a semiconductor chip to be disposed nearly in the center of the insulating resin substrate, a viahole formed from a conductive material filled in an opening leading from the other side of the insulating resin substrate to the wiring pattern, and a second conductive bump provided just above the viahole and projecting from the other side of the insulating resin substrate, the method including, according to the present invention, at least the following six steps of:

(a) attaching a light-transparent resin layer on the other side of the insulating resin substrate having a copper foil attached on the one side thereof, irradiating the other side of the insulating resin substrate with a laser beam from above the resin layer to form an opening leading to the copper foil, and cleaning the opening inside by removing the remaining resin;

(b) applying an electrolytic plating to the insulating resin substrate covered with a protective layer to fill an electrolytic copper in the opening in order to form a filled viahole;

(c) coating the insulating resin substrate with an electrolytic tin plating to fill the electrolytic tin plating layer in the opening formed in the light-transparent resin layer by the laser beam machining in order to form the second bump projecting to just above the viahole;

(d) separating the protective layer from the one side of the insulating resin substrate, then attaching a protective layer to the other side of the insulating resin substrate, and forming nearly in the center on the one side of the insulating resin substrate a plating photoresist layer having an opening corresponding to the position of a terminal of the semiconductor chip to be mounted;

(e) applying an electrolytic tin plating to the insulating resin substrate to fill an electrolytic tin in the opening in the plating photoresist layer in order to form the first conductive bump corresponding to the position of the terminal of the semiconductor chip to be mounted; and (f) removing the plating photoresist layer, then forming an etching photoresist layer corresponding to a predetermined wiring pattern extending from the first conductive bump toward the periphery of the insulating resin layer, and removing, by etching, a copper foil portion where the etching photoresist layer is not formed to form the predetermined wiring pattern.

(5) Also the above object can be attained by providing a method of producing a semiconductor chip mounting wiring board including an insulating resin substrate, a conductive bump provided nearly in the center on one side of the insulating resin substrate to mount a semiconductor chip, a wiring pattern extending from the conductive bump toward the periphery of the insulating resin substrate, a viahole formed, on the other side of the insulating resin substrate, from a conductive substance filled in an opening leading to the wiring pattern, and a conductive pad electrically connected to the viahole, the method including, according to the present invention, at least the following six steps of:

(a) forming, in the other side of the insulating resin substrate having a copper foil attached to one side thereof, an opening leading to the copper foil, filling a conductive substance in the opening to form a viahole, and exposing the conductive substance to outside the other side of the insulating resin substrate;

(b) pressing to spread the conductive substance exposed out of the opening to form the conductive pad electrically connected to the viahole;

(c) forming, on the one side of the insulating resin substrate, a plating photoresist layer having an opening corresponding to the position of a terminal of the semiconductor chip to be mounted nearly in the center of the one side of the insulating resin substrate;

(d) applying an electrolytic plating to the other side of the insulating resin substrate having a protective layer attached on that side thereof to fill the electrolytic plating layer into the opening and thus form the conductive bump corresponding to the position of the terminal of the semiconductor chip to be mounted;

(e) removing the protective layer and plating photoresist layer, and then forming an etching photoresist layer corresponding to a predetermined wiring pattern extending from the conductive bump toward the periphery of the insulating resin substrate; and (f) removing, by etching, a copper foil portion where the etching photoresist layer is not formed to form the predetermined wiring pattern.

(6) Also the above object can be attained by providing a method of producing a semiconductor chip mounting wiring board including an insulating resin substrate, a conductive bump provided nearly in the center on one side of the insulating resin substrate to mount a semiconductor chip, a wiring pattern extending from the conductive bump toward the periphery of the insulating resin substrate, a viahole formed, on the other side of the insulating resin substrate, from a conductive substance filled in an opening leading to the wiring-pattern, and a conductive pad electrically connected to the viahole, the method including, according to the present invention, at least the following six steps of:

(a) forming, in the other side of the insulating resin substrate having a copper foil attached to one side thereof, an opening leading to the copper foil, filling a conductive substance in the opening to form a viahole, and exposing the conductive substance to outside the other side of the insulating resin substrate;

(b) attaching, under pressure, a copper foil to one side of the insulative resin substrate with an adhesive layer applied under the copper foil;

(c) forming, on the one side of the insulating resin substrate, a plating photoresist layer having an opening corresponding to the position of a terminal of the semiconductor chip to be mounted nearly in the center of the one side of the insulating resin substrate;

(d) applying an electrolytic plating to the other side of the insulating resin substrate having a protective layer attached on that side thereof to fill the electrolytic plating layer into the opening and thus form the conductive bump corresponding to the position of the terminal of the semiconductor chip to be mounted;

(e) removing the protective layer and plating photoresist layer, then forming, on the copper foil attached to the one side of the insulating resin substrate, an etching photoresist layer corresponding to a predetermined wiring pattern extending from the conductive bump toward the periphery of the insulating resin substrate, and forming, on the copper foil attached to the other side of the insulating resin substrate, an etching photoresist layer corresponding to a predetermined wiring pattern including the conductive pad positioned just above the viahole; and (f) removing, by etching, a copper foil portion where the etching photoresist layer is not formed to form, on the one side of the insulating resin substrate, the predetermined wiring pattern extending from the conductive bump toward the periphery of the insulating resin substrate, and forming, on the other side of the insulating resin substrate, the predetermined wiring pattern including the conductive pad.

(7) Also the above object can be attained by providing a semiconductor module formed, according to the present invention, from:

semiconductor chip mounting wiring boards each including an insulating resin substrate, a conductive bump provided nearly in the center on one side of the insulating resin substrate to mount a semiconductor chip, a wiring pattern extending from the conductive bump toward the periphery of the insulating resin substrate, a viahole formed, on the other side of the insulating resin substrate, from a conductive substance filled in an opening leading to the wiring pattern, and a second conductive bump formed just above the viahole; and interlayer members each formed from an insulating resin substrate having formed nearly in the center thereof an opening to receive the semiconductor chip, and a conductive post formed from a conductive substance filled in a through-hole formed through the insulating resin substrate and projecting from either side of the insulating resin substrate, by stacking them alternately with an adhesive applied between them and applying hot-pressing to the stack.

(8) Also the above object can be attained by providing a semiconductor module formed, according to the present invention, from:

semiconductor chip mounting wiring boards each including an insulating resin substrate, a conductive bump provided nearly in the center on one side of the insulating resin substrate to mount a semiconductor chip, a wiring pattern extending from the conductive bump toward the periphery of the insulating resin substrate, a viahole formed, on the other side of the insulating resin substrate, from a conductive substance filled in an opening leading to the wiring pattern, and a second conductive bump formed just above the viahole; and interlayer members each formed from an insulating resin substrate having formed nearly in the center thereof an opening to receive the semiconductor chip, and a conductive post formed from a conductive substance filled in a through-hole formed through the insulating resin substrate and projecting from either side of the insulating resin substrate, by stacking them alternately with an adhesive layer applied between them and applying hot-pressing to the stack.

(9) Also the above object can be attained by providing a semiconductor module formed, according to the present invention, from:

semiconductor chip mounting wiring boards each including an insulating resin substrate, a conductive bump provided nearly in the center on one side of the insulating resin substrate to mount a semiconductor chip, a wiring pattern extending from the conductive bump toward the periphery of the insulating resin substrate, a viahole formed, on the other side of the insulating resin substrate, from a conductive substance filled in an opening leading to the wiring pattern, and a second conductive bump formed just above the viahole; and interlayer members each formed from an insulating resin substrate having formed nearly in the center on one side thereof an opening to receive the semiconductor chip, a predetermined wiring pattern formed at the periphery of the insulating resin substrate, a viahole formed from a conductive substance filled in an opening leading from the other side of the insulative resin substrate to the wiring pattern, and a conductive bump formed just above the viahole, by stacking them alternately with an adhesive applied between them and applying hot-pressing to the stack.

In the semiconductor modules set forth in (7) to (9) above, the semiconductor chip mounting wiring board should desirably be formed from a rigid insulating resin substrate and the interlayer member be from a rigid insulating resin substrate or unhardened prepreg.

A part of the wiring pattern corresponding to the viahole should desirably be shaped in the form of a conductive pad.

Also, the wiring pattern should preferably be formed not only on the one side of the insulating resin substrate but on the other side and electrically connected to the conductive pad positioned just above the viahole.

The viahole should desirably be formed from at least a metal selected from Cu, Sn, Pb, Ag, Au, Zn, In, Bi, solder and tin alloy.

In case the wiring pattern is formed on either side of the insulating resin substrate, the viahole should desirably be formed from a metal containing at least a metal whose melting point is lower than that of copper. Particularly, the viahole should preferably be formed to have two layers, one being formed by applying a plating of electrolytic copper filled near the bottom of the opening for forming the viahole and the other being formed by electrolytic plating of a metal whose melting point is lower than copper, filled near the top end of the opening.

Further, the viahole should desirably be formed by electrolytic or electroless plating, and more preferably be formed by electrolytic plating. Particularly, the viahole should preferably be formed by electrolytic copper plating.

Furthermore, in the semiconductor modules set forth in (7) to (9), the conductive bump should desirably be formed from at least a metal selected from Cu, Sn, Pb, Ag, Au, Zn, In, Bi, solder and tin alloy and which is electroless-plated.

Also, the conductive bump should desirably be formed by electrolytic plating or electroless plating, and more preferably be formed by coating electrolytic tin or solder plating.

Also, the first and second conductive bumps may be formed from the same metal or from metals of different melting points, respectively. Particularly, the first conductive bump should desirably be formed from a metal whose melting point is lower than that of the metal forming the second conductive bump, The melting points of the first and second conductive bumps should desirably be within a range of 150 to 240° C.

There should desirably be applied an adhesive layer on the other side of the insulating resin layer. One side or both sides of the interlayer member should desirably be coated with the adhesive. The adhesive should preferably be at least one resin selected from epoxy resin, polyimide resin, thermo-setting polyphenylene ether, composite resin of epoxy resin and thermo-setting resin, composite resin of epoxy resin and silicon resin, and BT resin.

Also, a matted layer should desirably be formed on the wiring pattern surface.

In the semiconductor modules set forth in (7) and (8) above, the through-hole formed in the interlayer member should desirably be shaped in the general form of a truncated cone, and thus the conductive post projecting from the through-hole should be shaped so that the diameter at one end thereof is smaller than that at the other end.

Also, the through-hole formed in the interlayer member should desirably be shaped to have such a form that a small-diameter cylinder is coaxial-joined to a large-diameter cylinder, and the conductive post projecting from the through-hole should desirably be shaped so that the diameter at one end thereof is smaller than that at the other end.

The ratio of the diameter at one end of the conductive post to that at the other end should preferably be 1:2 to 1:3.

These objects and other objects, features, and advantages of the present invention will become more apparent from the following detailed description of the preferred embodiments of the present invention when taken in conjunction with the accompanying drawings. It should be noted that the present invention is not limited to the embodiments but can freely be modified without departing from the scope and spirit thereof defined in the claims given later.

BRIEF DESCRIPTION OF THE DRAWINGS

FIGS. 19 to 22 show a part of the process of producing the semiconductor module from the semiconductor chip mounting wiring board according to the seventh embodiment of the present invention, interlayer member and copper foil.

BEST MODE FOR CARRYING OUT THE INVENTION

Figure 1:
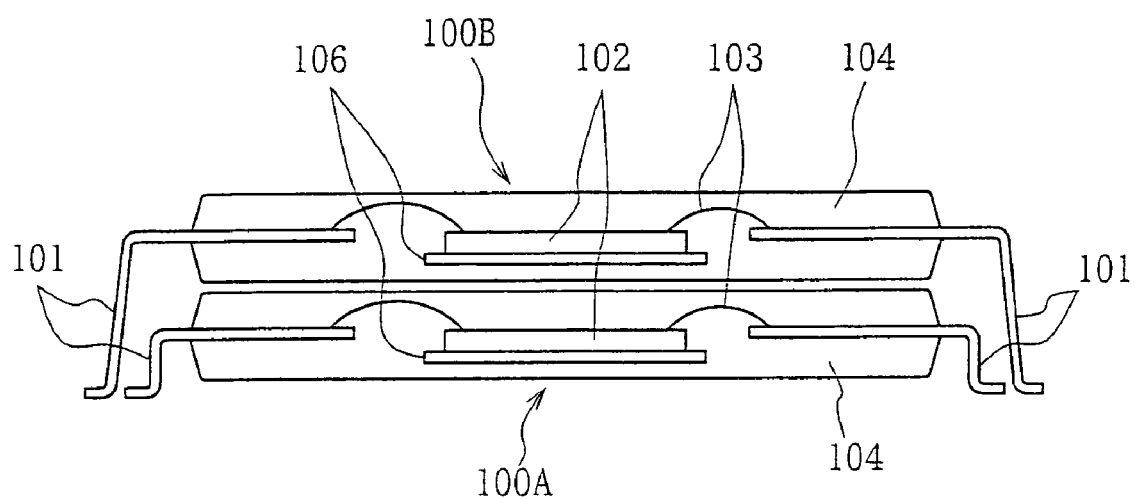
FIG. 1 is a schematic sectional elevation of a conventional IC package.
Figure 2A:
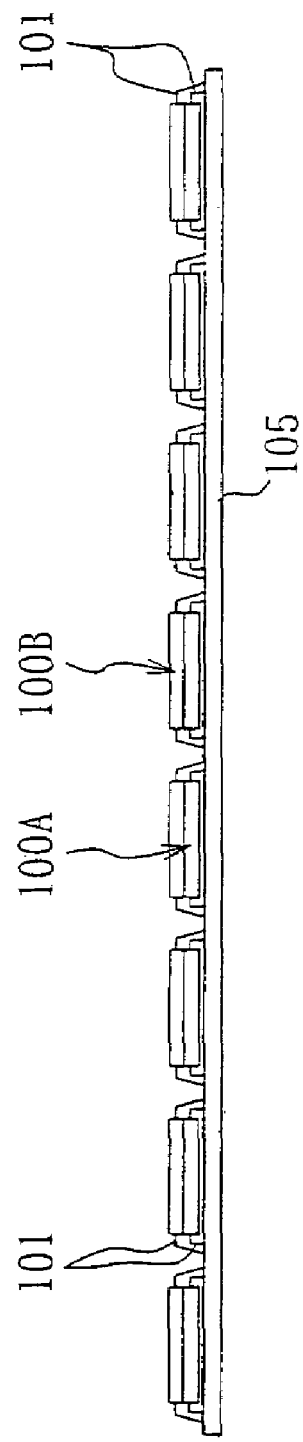
FIG. 2(a) is a schematic side elevation of a wiring board on which the conventional IC packages are mounted.
Figure 2B:
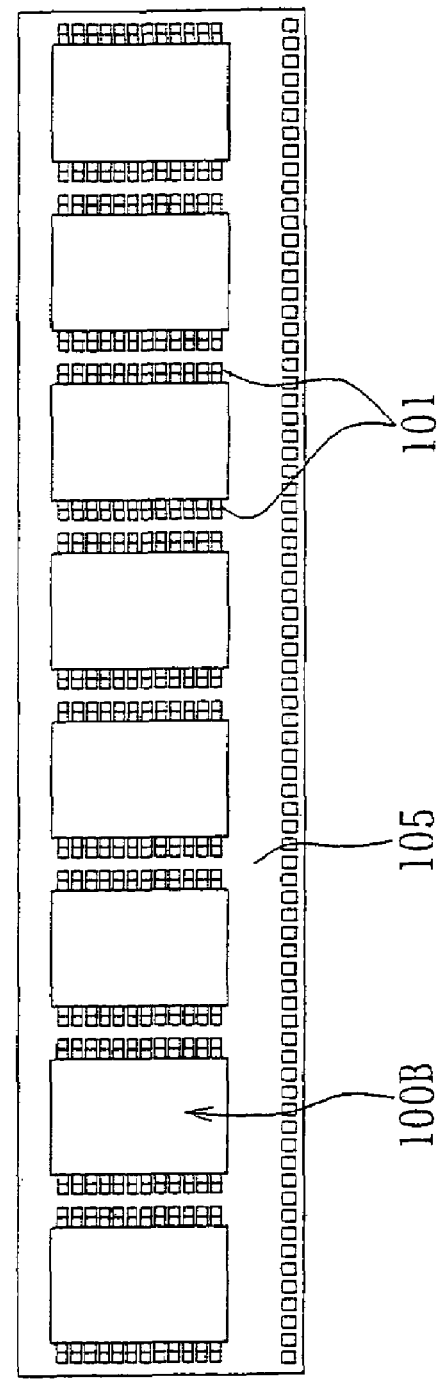
FIG. 2(b) is a schematic plan view of the wiring board in FIG. 2(a).

Note that the present invention will be described concerning a semiconductor chip mounting wiring board and semiconductor module formed by stacking a plurality of the semiconductor chip mounting wiring boards.

The semiconductor chip mounting wiring board according to the present invention is used to produce a semiconductor module by stacking and hot-pressing of the wiring boards each having a semiconductor chip such as an IC chip or the like mounted on conductive bumps and interlayer members each having an opening to receive the semiconductor chip, alternately on each other. The semiconductor module thus produced can be of a high mounting density and low profile type permitting a quick information transmission between the semiconductor chips, and is highly connection-reliable.

The first embodiment of the semiconductor chip mounting wiring board according to the present invention includes an insulating resin substrate having defined nearly in the center on one side thereof an area in which a semiconductor chip is to be mounted, a plurality of conductive bumps (will be referred to as "first conductive bump" hereunder) formed around the mounting area to mount a plurality of semiconductor chips, respectively, and a wiring pattern electrically connected to the first conductive bumps and extending from the mounting area toward the periphery of the insulating resin substrate.

Also, openings are formed which lead from the other side of the insulating resin substrate to the wiring pattern, a filled viahole is formed from a conductive substance filled in each of the openings, and an interconnecting conductive bump (will be referred to as "second conductive bumps" hereunder) is formed just above each viahole, respectively, and electrically connected to each interlayer member.

The wiring boards each having the semiconductor chip mounted thereon and interlayer members each having the opening to receive the semiconductor chip are stacked alternately on one another, solder balls or T pins as terminals for connection with external wires of a mother board or the like are provided on an outermost layer as necessary, and the stack of the circuit boards and interlayer members and another circuit board (I/O wiring board or the like) provided with such solder balls or T pins are further stacked on each other to form a semiconductor module having an improved mounting density, more functionality and lower profile.

For the above stacking, a wiring board having mounted thereon a semiconductor chip having mainly a computing function is laid at the surfacial side while a wiring board having mounted thereon a semiconductor chip having mainly a memory function is laid at the inner side, and between the semiconductor chips disposed is an interlayer member formed from an insulative resin and having an opening formed nearly in the center thereof to receive the semiconductor chip and conductive paths formed therein along the periphery thereof to make an electrical connection between the semiconductor chips. These elements are applied with hot-pressing to make a stack.

The above interlayer member should desirably be one of the following two: (1) An interlayer member formed from an insulating resin and having an opening formed nearly in the center thereof to receive the semiconductor chip and conductive posts formed, in the periphery thereof, from a conductive paste filled in through-holes formed through it and projecting to either side thereof, and (2) An interlayer member formed from an insulating resin and having an opening formed nearly in the center thereof to receive the semiconductor chip, a predetermined wiring pattern including at least a conductive pad, formed at the periphery thereof, viaholes formed from a conductive substance filled in an opening leading from the other side thereof to the wiring pattern, and conductive bumps formed just above the viaholes, respectively.

In the semiconductor module formed from the stack of the semiconductor chip mounting wiring boards and interlayer members, the semiconductor chip mounted with the first conductive bump of the mounting wiring board is received in the opening in the adjoining interlayer member and connected to the conductive post or viahole provided in the interlayer member by the wiring pattern extending toward the periphery of the insulating resin substrate, viahole and second conductive bump, and further connected to the semiconductor chip on the adjoining mounting wiring board. Thus, since the distance between the semiconductor chips is reduced and troubles caused by the wire resistance and inductance are reduced, electric information can be transmitted at a high speed without any delay.

Also, the second embodiment of the semiconductor chip mounting wiring board according to the present invention has a generally similar structure to that of the first embodiment except that a conductive pad electrically connected to the viahole is used instead of the second conductive bump electrically connected to the interlayer member to increase the area of contact with the conductive post or conductive bump of the adjoining interlayer member, to thereby compensate for any misregistration of the wiring boards during stacking of them. The semiconductor module formed from the above semiconductor chip mounting wiring-boards and interlayer members will have a generally similar structure to that of the semiconductor module formed from the first embodiment of the semiconductor chip mounting wiring board.

Further, in a variant of the semiconductor chip mounting wiring board according to the present invention, a wiring pattern is formed on one side of the insulating resin substrate, while on the other side of the insulating resin substrate, a semiconductor chip mounting area is formed nearly in the center, an interconnecting area for electrical connection with other circuit boards is formed around the semiconductor chip mounting area, an opening leading from the semiconductor chip mounting area and interconnecting area to the wiring pattern, and a viahole is formed from a conductive substance filled in the opening. Just above the viahole, there are formed a first conductive bump for mounting the semiconductor chip and a second conductive bump for electrical connection with other circuit boards, these first and second conductive bumps being projected, and the wiring pattern extends from the center toward the periphery of the insulating resin substrate to make an electrical connection between the viaholes corresponding to the first and second conductive bumps, respectively.

More particularly, in this variant, the first and second conductive bumps are formed on the side of the insulating resin substrate opposite to the side on which the wiring pattern is formed. The first conductive bump on which the semiconductor chip is to be mounted is connected to the wiring pattern via the viahole formed beneath it, and the wiring pattern is extended from the center of the insulating resin substrate toward the periphery and electrically connected to the viahole corresponding to the second conductive bump.

In the above variant of the semiconductor chip mounting wiring board, the interlayer member formed from the insulative resin substrate and which is to be stacked on the wiring board should desirably have an opening formed nearly in the center thereof to receive the semiconductor chip, a predetermined wiring pattern formed at the periphery of the insulating resin substrate and including at least a conductive pad, a viahole formed from a conductive substance filled in the opening leading from the other side of the insulating resin substrate to the wiring pattern, and a conductive bump formed just above the viahole.

Note that the insulating resin substrate used to form the semiconductor chip mounting wiring board according to the present invention may be made of an organic insulating resin. More particularly, the insulating resin substrate should preferably formed from a rigid laminated one selected from a nonwoven aramid fabric-epoxy resin-substrate, glass fabric-epoxy resin substrate, nonwoven aramid fabric-polyimide substrate, bismaleimide triazine resin substrate, FR-4 and FR-5 or a flexible one selected from polyphenylene ether (PPE) film, polyimide (PI) film and the like.

More specifically, the rigid insulative resin substrate is formed from a completely hardened resin, not from a semi-hardened prepreg as in the conventional semiconductor chip mounting wiring board. Because the completely hardened insulating resin is used to form the wiring board, the final thickness of the insulating resin substrate will not be changed when a copper foil is hot-pressed to the insulating resin substrate, so that the misregistration of the viaholes can be minimized and thus vialands can be formed to have a smaller diameter. Therefore, it is possible to improve the wiring density while decreasing the wiring pitch, and to maintain the substrate substantially constant. So, to form an opening for forming a filled viahole by the laser beam machining, laser beam machining conditions can easily be set.

A copper foil is attached to one side of the insulating resin substrate with a suitable resin adhesive applied under it, and a wiring pattern is formed by an etching as will be described later.

Instead of attaching the copper foil to the insulating resin substrate, a one-side copper-clad laminate may be used which has a copper foil attached beforehand to an insulating resin substrate.

Also, the copper foil attached to the insulating resin substrate should preferably be matted for an improved adherence and against warping of the laminated substrate. Use of the one-side copper-clad laminate is most preferable in the embodiments of the present invention.

The one-side copper-clad laminate is produced by stacking together a copper foil and a prepreg formed impregnating a thermo-setting resin such as epoxy resin, phenol resin, bis-maleimide-triazine resin or the like in a glass cloth and drying it to B stage and hot-pressing of the stack. The one-side copper-clad laminate is a rigid substrate easy to handle and most advantageous in respect of the manufacturing costs. Also, a metal layer may be formed on the surface of the insulating resin substrate by evaporating and then electroplating the metal.

The insulating resin substrate should be 10 to 200 μm thick, preferably be 15 to 100 μm, and optimally be 20 to 80 μm. If the thickness is smaller than above, the substrate will be weaker and difficult to handle. On the other hand, if the thickness is larger than the above, it will be difficult to form any fine opening and fill the conductive substance into the opening. Namely, it will not be possible to design the stacked semiconductor module to have a lower profile.

On the other hand, the copper foil to form the wiring pattern should be 5 to 36 μm, preferably be 8 to 30 μm, and optimally be 12 to 25 μm. If the thickness is smaller than the above, a laser beam used for forming an opening in which a viahole is to be formed will penetrate through the copper foil. On the other hand, if the thickness is larger than the above, it will be difficult to form any fine pattern by etching.

The opening for the viahole is formed by attaching a light-transparent resin film to the side of the insulating resin substrate opposite to the copper foil-attached side and irradiating a laser beam to the insulating resin substrate from above the resin film.

The resin film having the opening formed through it by the laser irradiation will serve as a printing mask when filling a conductive paste into that opening leading from the surface of the insulating resin substrate to the copper foil to form the viahole, and also it is used to adjust the projecting height of the conductive bump when forming the conductive bump just above the viahole surface after filling the conductive substance in the opening. Therefore, the resin film should desirably have an adhesive layer which can be separated from the adhesive layer after undergoing various steps of processing.

The resin film should desirably have an adhesive layer of 1 to 20 μm in thickness, for example, and it should desirably be formed from a film of ethylene terephthalate resin film (will be referred to as PET film hereunder) having a thickness of 10 to 50 μm.

The reason for the above is that since the projecting height of the conductive bump from the surface of the insulating resin substrate depends upon the thickness of the PET film, the projection will be too small with a film thickness of less than 10 μm while the molted conductive bump will spread too much on the boundary of connection with a film thickness of more than 50 μm, with the result that no fin pattern can be formed.

For the above laser beam machining, a carbon dioxide gas laser beam machine, UV laser beam machine, excimer laser beam machine or the like may be used. Especially, the carbon dioxide gas laser beam machine can make the laser beam machining at a high speed and at low costs, and thus it is most suitable for industrial use. The carbon dioxide gas laser machine is most desirable for the present invention.

The opening formed, by such carbon dioxide gas laser machining, in the insulating resin substrate having the above range of thickness should have a diameter of 50 to 200 μm. In the laser machining conditions for forming the opening, the pulse energy should desirably be 0.5 to 100 mJ, pulse width be 1 to 100 μs, pulse interval be 0.5 ms or more and number of shots be 3 to 50.

The reason why the opening diameter is limited as above is that with an opening diameter of less than 50 μm, it will be difficult to fill the conductive paste into the opening, which leads to a lower reliability on the electrical connection while with an opening diameter of more than 200 μm, it will be difficult to mount parts at a high density.

For assuring a high reliability on the electrical connection, it is desirable to remove resin residuals on the wall of the opening by desmearing, for example, chemically by immersing the substrate in an oxidizer such as acid, permanganic acid, chromic acid or the like or physically by plasma or corona discharge before filling the conductive substance into the opening to form the viahole.

More particularly, in case the conductive substance is filled into the opening to form the viahole with an adhesive layer and protective film being attached to the insulating resin substrate, a dry desmearing should desirably be effected using the plasma or corona discharge. Especially, a plasma cleaning using a plasma cleaning machine is most preferable among the above dry desmearing processes for this purpose.

In this embodiment, the opening for forming the viahole therein should desirably be formed by the laser beam machining but it may be formed in a mechanical manner such as drilling, punching or the like.

For forming the viahole in the opening having been desmeared as above, the conductive substance may be filled by plating or filling a conductive paste. Especially, for plating the conductive substance to form the viahole, a protective film should be pre-attached on the wall of the opening to prevent the plating solution from getting in contact with the wall of the opening against deposition of the copper foil on the insulating resin substrate and then filling the conductive substrate into the opening.

The conductive substance can be filled into the opening by either electrolytic or electroless plating process, but the electrolytic plating process should desirably be adopted to this end.

For the above electrolytic plating, any one selected from Sn, Pb, Ag, Au, Cu, Zn, In, Bi, solder and tin alloy may be used. Among them, however, the most preferable metal is electrolytic copper.

For forming the viahole, a single metal may be filled in the opening by the electrolytic plating. Alternatively, however, electrolytic copper may first be filled in the opening and then electrolytic tin or electrolytic solder, for example, whose melting point is lower than that of the copper may be filled into the remaining space in the opening.

The above filling of the metal whose melting point is lower than that of the copper to near the opening of the viahole will improve the adhesion of a wiring pattern formed on either side of the insulating resin substrate to a copper foil attached under pressure to the other side of the substrate.

For filling the conductive substance into the opening by the electrolytic plating process, the electrolytic plating is effected using the copper foil formed on the insulating resin substrate as a plating lead. Since the copper foil (metal layer) is formed over the one side of the insulating resin substrate, the current density will be uniform and the opening can be filled with the electrolytic plating metal to an even height.

Note that before the electrolytic plating process, the surface of the metal layer in the opening should be activated with acid or the like.

Also, after completion of the electrolytic plating, the electrolytic plating (metal) which is outwardly convex from the surface of the insulating resin substrate may be polished by a belt sander or by buffing to be flat or somewhat higher than the surface of the insulating resin substrate.

More specifically, when flared by a press to be flat, the electrolytic plating (metal) which is outwardly convex from the surface of the insulating resin substrate will form a conductive pad (land) whose area is wider than the opening in which the viahole is to be formed. This will be advantageous for an improved reliability on the electrical connection with the conductive bump in the interlayer member which will be described later.

Also, a part of the opening is filled by filling the conductive paste or by electrolytic plating or electroless plating in place of filling the conductive substance by the plating, and the remaining space of the opening may be filled with the conductive paste.

The above conductive paste may be a one comprising metal particles of one or more than two selected from silver, copper, gold, nickel and various types of solders.

Also, the metal particles may be coated on the surface thereof with another type of metal. More particularly, the metal particles may be of copper and coated with a noble metal such as gold or silver.

Note that the conductive paste should desirably be an organic mixture of the metal particles, thermo-setting resin such as epoxy resin and polyphenylene sulfide (PPS).

Note however that in case the opening for the viahole is formed by the laser beam machining to have a fine diameter of 50 to 200 μm, it is more practical to fill the conductive substance into the opening by electrolytic plating since air bubbles are likely to remain if the conductive paste is filled in the opening.

Next, the conductive bump (will be referred to as second conductive bump hereunder) formed on the exposed surface of the viahole is intended to assure an electrical connection with the interlayer member. At this time, it is formed by plating or printing a conductive paste. For forming the second conductive bump, it is desirable to fill the conductive substance, by plating, into the opening formed in the protective film by the laser irradiation to form a plating to a thickness equivalent to the thickness of the protective film.

The plating in the opening may be done by either the electrolytic plating or electroless plating. However, the electrolytic plating is more suitable.

As an electrolytic plating metal, any one is selected from Sn, Pb, Ag, Au, Cu, Zn, In, Bi, solder and tin alloy. Of these metals, however, the electrolytic tin plating is most suitable.

The second conductive bump should desirably be formed to have a height of 3 to 60 μm for the reason that if the thickness is less than 3 μm, resulted bumps will be different in height from each other and the difference cannot be corrected by deforming the bump while a bump formed to have a thickness of more than 60 μm will have an increased resistance and spread horizontally to cause a short-circuiting.

Also, the second conductive bump may be formed by filling the conductive paste into the opening formed on the protective film by the laser irradiation, instead of the plating process.

In this case, any height irregularity likely to take place when the bump is formed by electrolytic plating can be corrected by adjusting the filled amount of the conductive paste to provide many bumps having the same height.

The bump formed from the conductive paste should desirably be semi-hardened because the semi-hardened conductive paste is sufficiently hard and can be penetrated through the organic adhesive layer softened during hot-pressing. Also, when the bump is deformed during the hot-pressing, it will have an increased area of contact with the interlayer member and a decreased resistance and thus the difference in height between the bumps can be corrected.

In addition, the conductive bump can be formed by a screen printing of the conductive paste using a metal mask having openings formed therein in predetermined positions, by printing a solder paste whose melting point is low, by a solder plating or by immersing the insulating resin substrate in a solder solution.

The low melting-point metal may be a Pb—Sn solder, Ag—Sn solder, indium solder or the like.

On the other hand, the conductive bump (will be referred to as first conductive bump hereunder) formed on the copper foil-attached side (metal layer) of the insulating resin substrate to mount a semiconductor chip such as an IC chip is formed by plating, printing a conductive paste or sputtering. The plating process should desirably be used for this purpose.

More specifically, after a dry photoresist film is attached, or a liquid photoresist is applied, to the copper foil-attached side of the insulating resin substrate, the substrate should preferably be exposed through a mask and developed to form a plating photoresist layer having openings in which bumps are to be formed for electrical connection with a semiconductor chip and a bump be formed in each opening by plating.

The bump should desirably be formed by either electrolytic plating or electroless plating. Of them, however, the electrolytic plating is more desirable.

As an electrolytic plating metal, any one is selected from Sn, Pb, Ag, Au, Cu, Zn, In, Bi, solder and tin alloy. Of these metals, however, the electrolytic tin plating is most suitable.

The first conductive bump may be shaped to be a cylinder, elliptic cylinder, rectangular parallelopiped or cube, and should desirably have a height of 1 to 30 μm.

The reason for the above is that if the height is less than 1 μm, the conductive bump cannot be uniformly formed while migration or whiskering is likely to take place if the thickness is more than 30 μm. More specifically, the height should most preferably be 5 μm.

In case the first conductive bump is shaped to be a cylinder or elliptic cylinder, the diameter thereof should desirably be 50 to 200 μm, and most preferably be 80 μm.

After forming the first conductive bump on the copper foil, alkali such as NaOH, KOH or the like, acid such as sulfuric acid, acetic acid or the like, or a solvent such as alcohol or the like is used to completely remove the plating photoresist layer.

Note that through the first conductive bump should preferably be formed by electrolytic tin plating similarly to the second conductive bump since the temperature can easily be controlled, the first conductive bump may be formed from a metal whose melting point is lower than the metal for the second conductive bump. The melting point of such a metal should desirably be within a range of 150 to 240° C.

For example, in case the first conductive bump is formed from an Sn—Pb alloy whose melting point is 185° C. while the second conductive bump is formed from Sn whose melting point is 232° C., only the first conductive bump is melted when a semiconductor chip is mounted and thus the second conductive bump can advantageously be maintained in shape.

The wiring pattern is formed on the copper foil-attached side of the insulating resin substrate by attaching a photoresist, or applying a liquid photoresist, to the copper foil-attached side, then placing a mask having a predetermined wiring pattern, forming a plating photoresist layer by exposure and development, and etching the copper foil where no etching photoresist is applied.

The wiring pattern has multiple conductor pads (lands) formed correspondingly to terminals of a semiconductor chip to be mounted nearly in the center of the substrate, outer leads extending from the conductor pads towards the outer circumference of the substrate and having a very small width, and multiple conductor pads (lands) formed near the ends of the outer leads correspondingly to the viaholes. The first conductor bumps for mounting the semiconductor chip is formed on the former conductor pad while a conductive post or bump of the interlayer member to be stacked is connected to the latter conductor pad.

The wiring pattern should preferably be 5 to 30 μm in thickness, and more preferably be 12 μm. Also, the ratio (L/S) between the lead width and inter-lead distance of the leads should preferably be 50/50 μm to 100/100 μm. Further, the each of the lands formed on the wiring pattern should be 150 to 500 μm in diameter, and more preferably be 350 μm.

The wiring pattern is formed by etching with at least any one selected from sulfuric acid-hydrogen peroxide, persulfate, cupric chloride and ferric chloride aqueous solutions.

The surface of the wiring pattern may be matted as necessary to improve the adhesion with the adhesive layer which joins the semiconductor mounting wiring board and adhesive layer to each other, thereby permitting to prevent any delamination.

The above surface matting process should desirably be done by soft etching, blackening (oxidizing) and reduction, forming a plating acicular alloy of copper, nickel and phosphorus (INTERPLATE (trade name) by Ebara Yugilite Co., Ltd) or by etching with an etching solution (MECH ETCHBOND (trade name) by Mech Corporation).

Also, the matted layer formed on the wiring pattern may further be coated with a metal layer as necessary. The metal layer may be of any one selected from titanium, aluminum, zinc, iron, indium, thallium, cobalt, nickel, tin, lead and bismuth.

The coating metal layer should desirably be 0.01 to 3 μm in thickness for the reason that if the thickness is less than 0.01 μm, the metal layer will not possibly cover the matted layer completely while the coating metal will be filled in a concavity of the matted layer and thus cancel the matted layer if the thickness is more than 3 μm. Therefore, the most desirable range of thickness is 0.03 to 1 μm. The matted layer may be coated with the metal layer with the use of a tin-substituted solution of boron tin fluoride and thiourea, for example.

An adhesive layer may be formed on the side of the insulating resin substrate opposite to the copper foil-attached side as necessary, preferably by applying a resin to the surface of the insulating resin substrate and drying it to the unhardened state.

The adhesive layer should desirably be formed from an organic adhesive. The organic adhesive should preferably be at least a resin selected from epoxy resin, polyimide resin, thermo-setting polyphenylene ether (PPE), composite of epoxy resin and thermo-setting resin, composite of epoxy resin and silicon resin, and BT resin.

Note that the solvent for the organic adhesive may be NMP, DMF, acetone or ethanol.

The unhardened resin as the organic adhesive may be applied using a curtain coater, spin coater, roll coater, spray coater or by screen printing.

After the application of the resin, air bubbles can completely be removed from the boundary between the matted layer and resin by decompression and deaeration. Note that the adhesive layer may be formed by laminating an adhesive sheet.

The adhesive layer should desirably be 5 to 50 μm thick. The adhesive layer should preferably be pre-cured for easy handling.

A semiconductor chip to be mounted on the wiring board is mounted on the wiring pattern with the first conductive bump being under the semiconductor chip. The first conductive bump and semiconductor chip can be connected to each other by reflowing the conductive substance with the semiconductor chip and wiring board being aligned with each other or by heating and melting the bump beforehand.

In the latter of the above methods of connecting the conductive bump and semiconductor chip to each other, the bump should desirably be heated at a temperature of 60 to 220° C. for the reason that if the temperature is below 60° C., the conductive metal will not be melted while a short-circuit will take place between the conductive metal forming the bump and adjacent bump if the temperature exceeds 220° C.

More specifically, in case tin is used as the conductive metal, the heating temperature should desirably be within a range of 80 to 200° C. for the reason that when the heating temperature is within this range, the bump can be melted for connection while being kept in an intended shape.

A sealing resin is filled in a space between the semiconductor chip and interlayer member as necessary to avoid any mismatching between the semiconductor chip and interlayer member, caused by thermal expansions of them. Such a sealing resin may be any one selected from thermo-setting resin, thermoplastic resin, ultraviolet-setting resin, photosensitive resin and the like.

More particularly, as the sealing resin, there may be used any one of a liquid resin containing any of epoxy resin, silicon resin, polyimide resin, phenol resin and fluoroethylene resin or a non-conductive resin film (e.g., NCF) formed from any of the resins.

The insulating resin substrate used as the interlayer member stacked along with the wiring board having a semiconductor chip mounted thereon may be a similar organic insulating substrate to that used in the semiconductor chip mounting wiring board. Namely, a rigid insulating resin substrate or semi-hardened prepreg may be used as the substrate as the interlayer member.

The insulating resin substrate as the interlayer member is shaped to have a larger thickness than the height from the top of the semiconductor chip mounting wiring board to the top of a semiconductor chip mounted on the wiring board and have the same form as the semiconductor chip mounting wiring board.

The insulating resin substrate as the interlayer member should optimally be 10 to 500 μm, preferably be 50 to 200 μm, and more preferably be 100 to 150 μm for the reason that if the thickness is smaller than the above smallest one, the substrate will have a reduced strength and thus difficult to handle while it will be difficult to form any fine through-hole and fill a conductive paste into the through-hole if the thickness is larger than the above largest one.

The through-hole is formed is formed in the interlayer member similarly to the opening in which the viahole is formed, namely, by attaching a light-transparent resin film to either side of the insulative resin substrate and irradiating a laser beam to the substrate from above the resin film.

The resin film thus having the opening formed therein by the laser beam irradiation works to adjust the height of projection, from the surface of the insulating resin substrate, of a conductive post formed by filling in a conductive paste into the through-hole. The resin film should desirably include an adhesive layer which is separable from the adhesive layer after the insulating resin substrate has undergone various processes.

The resin film should preferably include an adhesive layer of 1 to 20 μm in thickness and PET film of 10 to 50 μm, for example.

The reason for the above is that the height of projection of the conductive post from the surface of the insulating resin substrate depends upon the thickness of the PET film. Thus, if the thickness of the PET film is less than 10 μm, the projection will be too short, resulting in a poor connection while the molten conductive post will spread too much at the boundary of connection and thus no fine pattern can be formed if the thickness is larger than 50 μm.

For the above laser beam machining, a laser beam machine should optimally be a carbon dioxide gas laser machine, and the through-hole formed in the insulating resin substrate having the above range of thickness should have a diameter of 50 to 250 μm. In the laser machining conditions for forming the through-hole, the pulse energy should desirably be 0.5 to 100 mJ, pulse width be 1 to 100 μs, pulse interval be 0.5 ms or more and number of shots be 3 to 50.

The reason why the through-hole diameter is limited as above is that with a diameter of less than 50 μm, it will be difficult to fill the conductive paste into the through-hole, which leads to a lower reliability on the electrical connection while with a diameter of more than 250 μm, it will be difficult to mount parts at a high density.

The above through-hole is cylindrical with the top and bottom hole diameters being equal to each other. A conductive paste is filled in this through-hole to form the conductive post. Thus, the conductive post projecting upward and downward from the surface of the insulating resin substrate has the same diameter at both the top and bottom ends thereof.

Alternatively, the through-hole may be shaped to have different diameters at the top and bottom ends thereof. For example, the through-hole may be shaped to have a truncated cone-like section tapering from one end to the other, or to have a section like a coaxial juncture of a small-diameter cylinder and large-diameter cylinder.

The conductive post formed from the conductive paste filled in such a through-hole should preferably have a ratio, between the upper and lower diameters thereof of 1:2 to 1:3, and more preferably of 1:2 to 2.5.

The reason why the diameter ratio should be within the above range is that the conductive paste can be filled in the through-hole to the full extent to prevent any misregistration of contact points due to pressing during stacking the semiconductor chip mounting wiring boards and interlayer members and thus improve the connection reliability.

In case the interlayer member is formed from an unhardened prepreg, the through-hole inside has not to be desmeared before filling the conductive paste into the through-hole to form the conductive post. However, if case the interlayer member is formed from a rigid resin substrate such as glass fabric-epoxy resin substrate, it is desirable for a high connection reliability to desmear the through-hole inside by a chemical removing method in which any remaining resin in the through-hole is removed by immersing the insulating resin substrate in an oxidizer such as acid, permanganic acid or chromic acid or by a physical removing method in which plasma discharge or corona discharge is used.

More particularly, in case the remaining resin is removed with the adhesive layer and protective film being attached to the rigid insulating rein substrate, a dry desmearing by plasma discharge or corona discharge should desirably be used. Especially, a plasma cleaning using a plasma cleaning machine is most preferable among the above dry desmearing processes for this purpose.

The conductive paste is filled into the through-hole formed by the laser beam machining and desmeared as necessary by screen printing, for example, from above the protective film attached to either side of the insulating resin substrate.

The above conductive paste may be a one comprising metal particles of one or more than two selected from silver, copper, gold, nickel and various types of solders.

Also, the metal particles may be coated on the surface thereof with another type of metal. More particularly, the metal particles may be of copper and coated with a noble metal such as gold or silver.

Note that the conductive paste should desirably be an organic mixture of the metal particles, thermo-setting resin such as epoxy resin and polyphenylene sulfide (PPS).

The height of projection, from the surface of the insulating resin substrate, of the conductive post formed on the interlayer member, depends upon the thickness of the PET film and thus the thickness of the PET film should desirably be within a range of 10 to 50 μm.

The reason for the above range of height of projection is that if the thickness of the PET film is less than 10 μm, the projection will be too short, resulting in a poor connection while the molten conductive post will spread too much at the boundary of connection and thus no fine pattern can be formed if the thickness is larger than 50 μm.

The conductive post formed from the conductive paste should desirably be semi-hardened because the semi-hardened conductive paste is sufficiently hard and can be penetrated through the organic adhesive layer softened during hot-pressing. Also, when the conductive post is deformed during the hot-pressing, it will have an increased area of contact and a decreased resistance and thus the difference in height between the conductive posts can be corrected.

The semiconductor chip mounting wiring boards and interlayer members are alternately stacked on one another, then another wiring board such as an I/O (input/output) wiring board is stacked on the outermost layer, and pressed together or solder balls or T pins are provided on the conductive pads of the I/O wiring board after pressing the wiring boards, interlayer members and I/O wiring board, to form a semiconductor module.

At this time, the semiconductor chip mounting wiring boards and interlayer members can be stacked on one another in many different manners. For example, a semiconductor chip mounting wiring board having no viahole formed therein is disposed as an uppermost layer with the side thereof having the semiconductor chip mounted thereon directed downward and an interlayer member is disposed under the semiconductor chip. The interlayer member receives, in the central opening thereof, the semiconductor chip mounted on the mounting wiring board. Under the interlayer member, there are stacked a mounting wiring board and interlayer member on each other, and the I/O wiring board is disposed as a lowermost layer.

The I/O wiring board as the lowermost layer is a both-side wiring board in which a wiring pattern is formed on either side of an insulating resin substrate and the wiring patterns on the opposite sides of the insulating resin substrate are electrically connected to each other by viaholes formed from a solder or conductive paste filled in through-holes formed through the insulating resin substrate, and a part of the wiring pattern, corresponding to the position of the conductive bump formed in the interlayer member, is formed as a conductive pad.

Also, in a variant of the I/O wiring board, a conductive foil such as a copper foil is attached with an adhesive to the surface of the interlayer member as the lowermost layer, from which the second conductive bump is projected, and etched to form a conductive pad corresponding to the second conductive bump, and a solder ball or T pin is disposed on the conductive pad to form a semiconductor module.

To stack together the mounting wiring boards, interlayer members and I/O wiring board, positioning holes formed beforehand in each of the boards are detected optically by a CCD camera or the like for registering the boards.

The above stack is pressed with a pressure of 0.5 to 5 MPa while being heated at a temperature of 50 to 250° C. to integrate all the circuit boards together by one press-molding. The heating temperature should preferably be within a range of 160 to 200° C.

Thereafter, a nickel-gold layer is formed on the conductive pad of the I/O wiring board as the lowermost layer and a solder ball or T pint is joined to the gold-nickel layer to form an interconnecting terminal for connection to an external circuit board, for example, a mother board.

Embodiments of the semiconductor chip mounting wiring board and semiconductor module according to the present invention will be described with reference to the accompanying drawings.

Figure 9A:
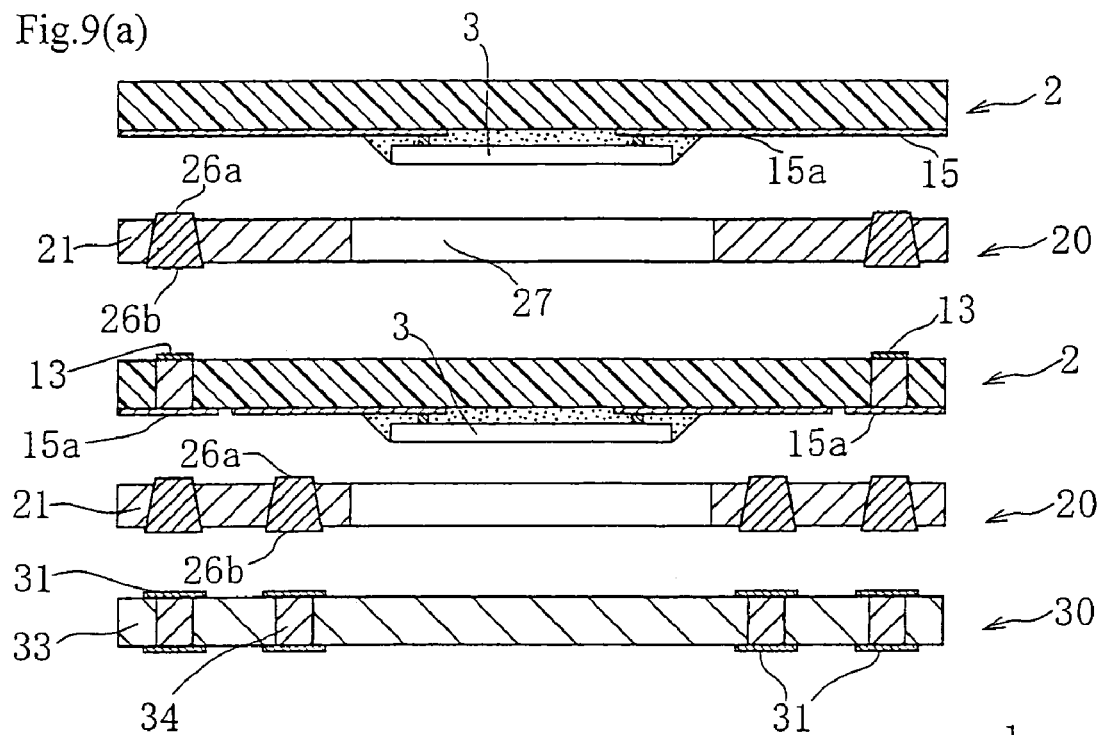
FIG. 9(a) is a perspective view of the semiconductor chip mounting wiring board according to the second embodiment of the present invention, interlayer member and I/O wiring board, stacked on each other.
Figure 9B:
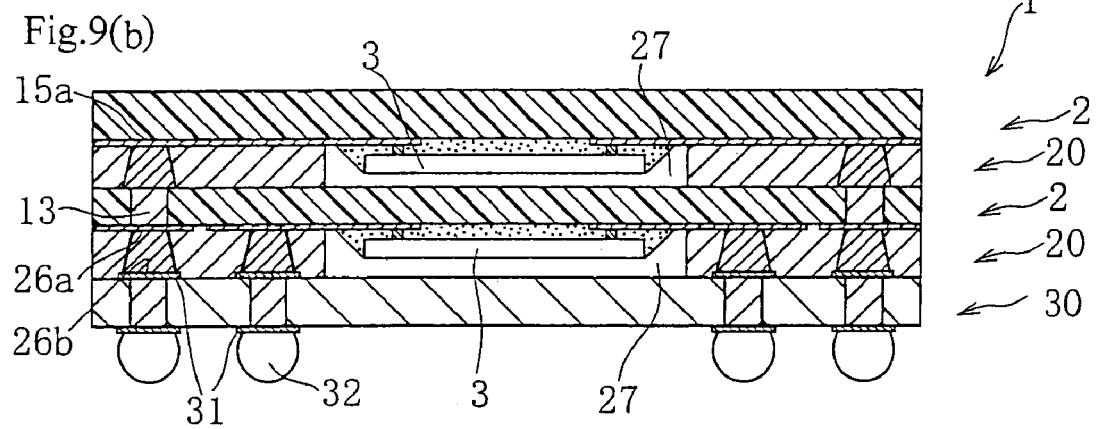
FIG. 9(b) is a sectional view of the semiconductor module produced by applying hot-pressing to the stack shown in FIG. 9(a).
Figure 10A:
FIGS. 10(a) to 10(f) show a part of the process of producing the interlayer member used in a third embodiment of the present invention.
Figure 10B:
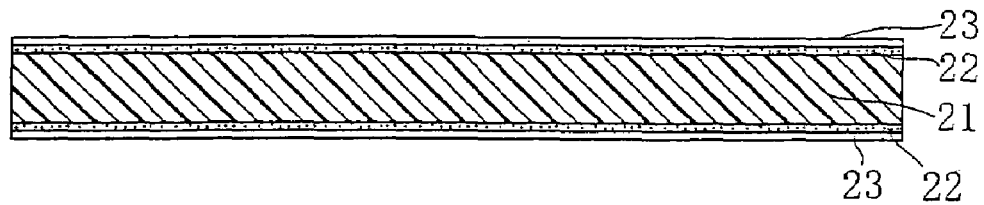
Figure 10C:
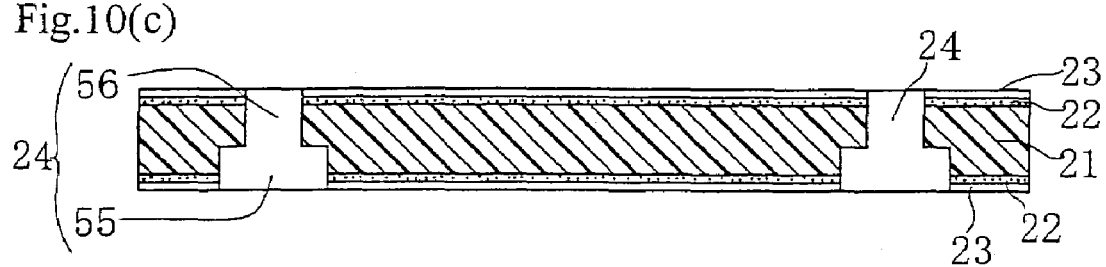
Figure 10D:
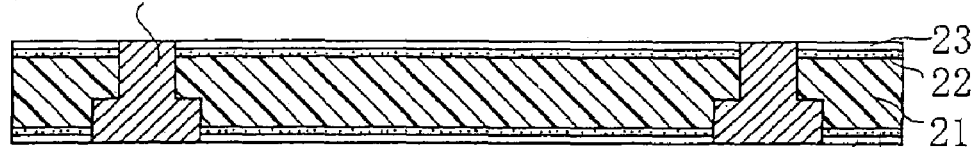
Figure 10E:
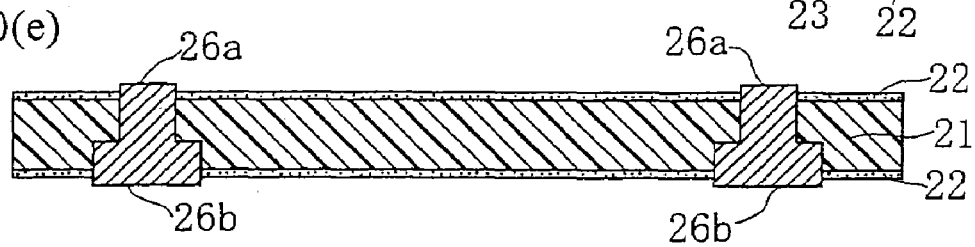
Figure 10F:
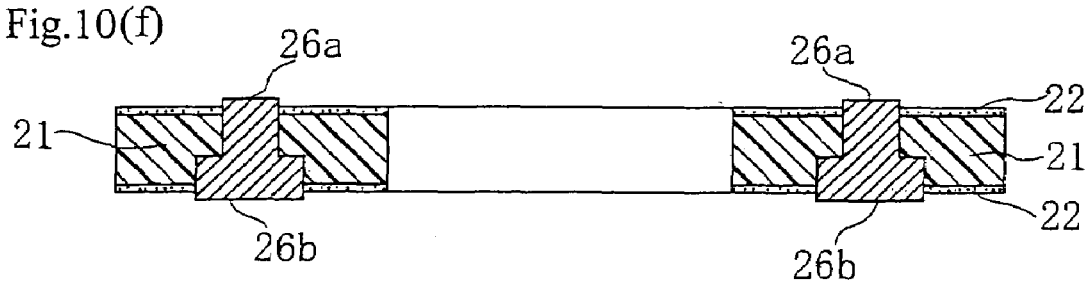

The semiconductor module is generally indicated with a reference 1 (as best shown in FIG. 9(b). As shown in FIG. 9(b) for example, the semiconductor module 1 is formed by stacking semiconductor chip mounting wiring boards 2 each having a semiconductor chip 3 mounted thereon and interlayer members 20 alternately on one another, attaching an I/O wiring board 30 to the lowermost layer (interlayer member 20 in this case), and heating and pressing these module components together. The procedure for forming the semiconductor module 1 will be described in detail below.

(1) The starting material for the semiconductor chip mounting wiring board 2 according to the present invention is an insulating resin substrate 5 having a copper foil 6 attached to one side thereof.

The above insulating resin substrate may be a rigid laminated one selected from a glass fabric-epoxy resin substrate, glass fabric-bismaleimide triazine resin substrate, glass fabric-polyphenylene ether resin substrate, nonwoven aramide fabric-epoxy resin substrate and nonwoven aramid fabric-polyimide substrate.

Of them, however, the glass fabric-epoxy resin substrate is most suitable for the insulating resin substrate.

The insulating resin substrate should most preferably be 20 to 60 μm thick, and the copper foil should most preferably be 12 to 25 μm.

Figure 3A:
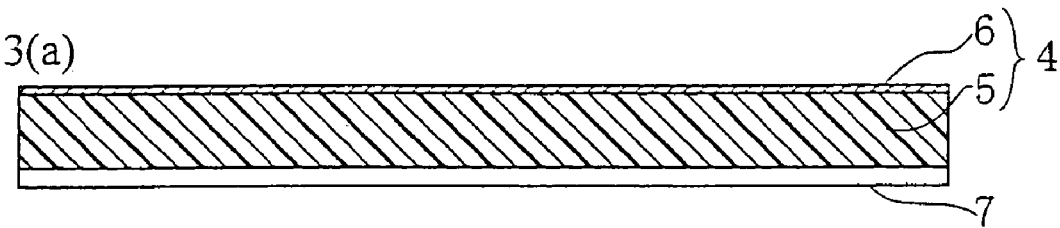
FIGS. 3(a) to 3(e) show a part of the process of producing the semiconductor chip mounting wiring board according to a first embodiment of the present invention.

As the insulating resin substrate 5 and copper foil 6, it is most preferable to use a one-side copper-clad laminate 4 (as shown in FIG. 3(a)) formed by impregnating a glass fabric with epoxy resin to prepare a B-stage prepreg, stacking the prepreg and a copper foil on each other and heating and pressing them together.

The reason for the above is that the wiring pattern and viahole will be accurately positioned without any dislocation during handling after the copper foil 6 is etched as will be described in detail later.

(2) Then, a protective film 7 is attached to the side of the insulating resin substrate 5 opposite to the side to which the copper foil 6 is attached (as shown in FIG. 3(a)).

The protective film 7 is provided to adjust the height of a conductive bump which will be described in detail later. It is formed from polyethylene terephthalate (PET) film having an adhesive layer provided on the surface thereof.

In the PET film 7, the adhesive layer is 1 to 20 μm in thickness, and film itself is 10 to 50 μm thick.

Figure 3B:
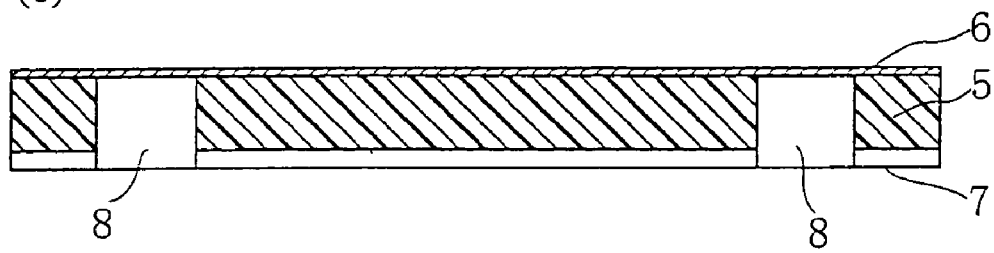

(3) Laser beam is irradiated from above the PET film 7 on the insulating resin substrate 5 to form an opening 8 leading from the surface of the insulating resin substrate 5 to the copper foil 6 (as shown in FIG. 3(b)).

The laser beam machining should desirably be made by a pulse oscillation type carbon dioxide gas laser beam machine with a pulse energy of 0.5 to 100 mJ, pulse width of 1 to 100 μs, pulse interval of 0.5 ms or more and number of shots of 3 to 50.

The opening 8 formed under the above laser beam machining conditions should preferably have a diameter of 50 to 200 μm.

(4) For assuring a high reliability on the electrical connection, it is desirable to remove resin residuals on the inner wall of the opening 8 formed in the step (3) above by desmearing, for example, by a dry desmearing using plasma or corona discharge.

(5) Next, a protective film is attached to the side of the insulating resin substrate 5 on which the copper foil 6 is attached, and electrolytic copper is filled in the desmeared opening 8 by electrolytic copper plating to form a viahole 9.

Figure 3C:
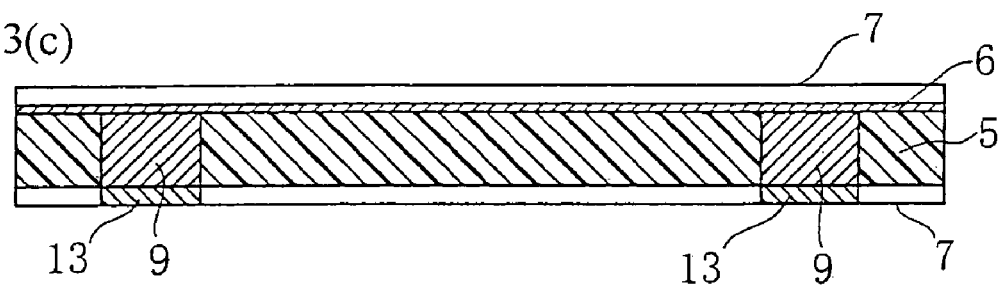

(6) Thereafter, electrolytic tin plating is applied to the insulating resin substrate 5 to fill the electrolytic tin in the opening 8 formed in the PET film 7 by the laser irradiation thereby forming a second conductive bump 13 just above the viahole 9 for connecting with any other wiring board (as shown in FIG. 3(c)).

Figure 3D:
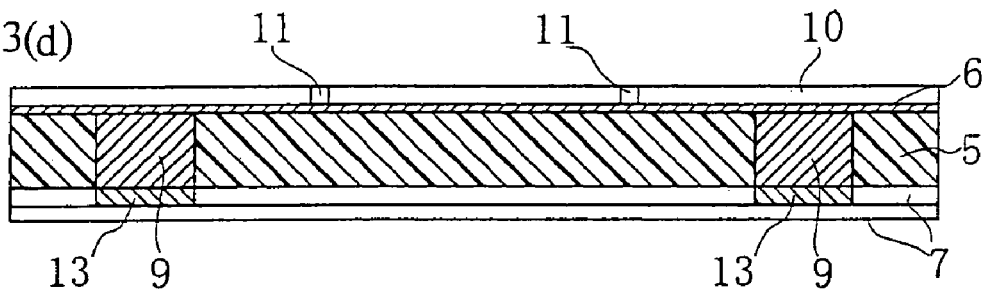

(7) Next, the PET film 7 is separated from on the copper foil 6 on the insulating resin substrate 5, then an additional PET film 7 is attached to the PET film 7 attached to the side of the insulating resin substrate 5 opposite to the side on which the copper foil 6 is attached, a photosensitive dry film is attached to the side of the insulating resin substrate 5 on which the copper foil 6 is attached, and the insulating resin substrate 5 is subjected to masked exposure and development to form a plating photoresist layer 10 having formed therein an opening 11 in which there is to be formed a bump used for electrical connection with a semiconductor chip (as shown in FIG. 3(d)).

Figure 3E:
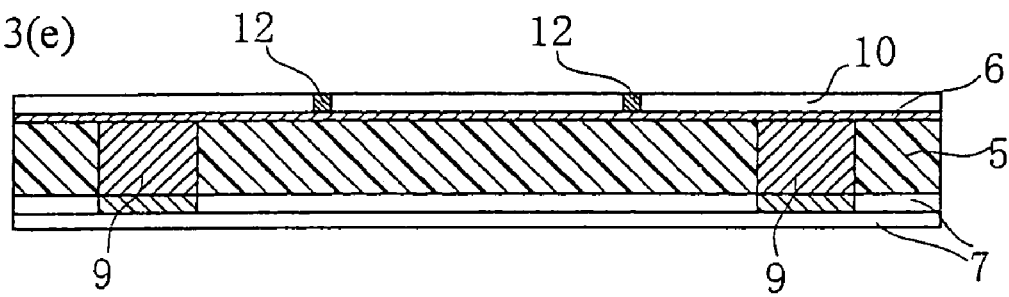
Figure 4F:
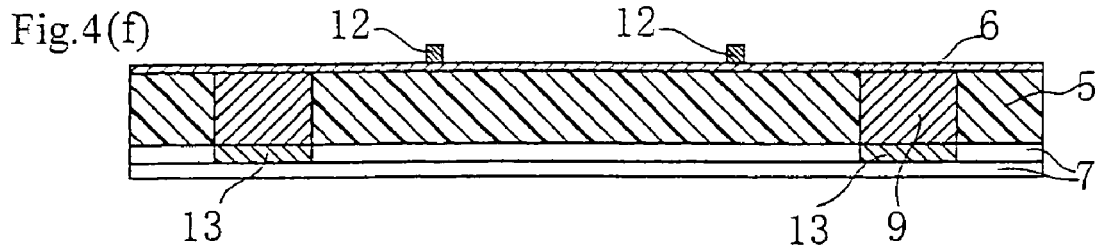
FIGS. 4(f) to 4(j) also shown apart of the process of producing the semiconductor chip mounting wiring board according to the first embodiment of the present invention.

(8) Electrolytic copper plating is applied to the insulating resin substrate 5 to fill the electrolytic tin in the opening 11 formed in the plating photoresist layer 10 to form, one the copper foil 6, a first conductive bump 12 for mounting a semiconductor chip (as shown in FIG. 3(e)). Thereafter, the dry film forming the plating photoresist layer 10 is separated (as shown in FIG. 4(f)).

Figure 4G:
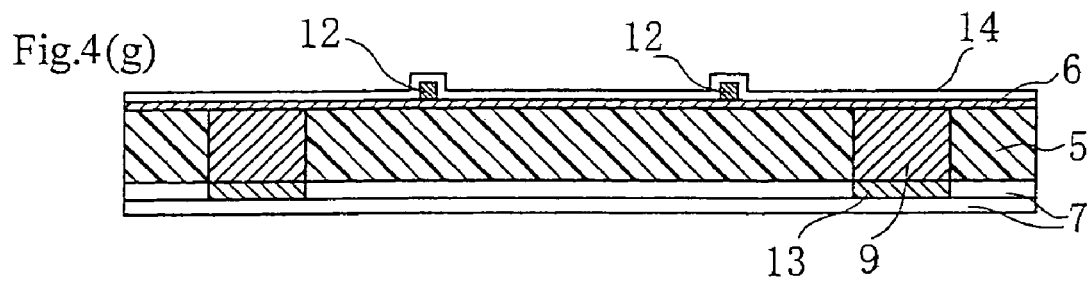
Figure 4H:
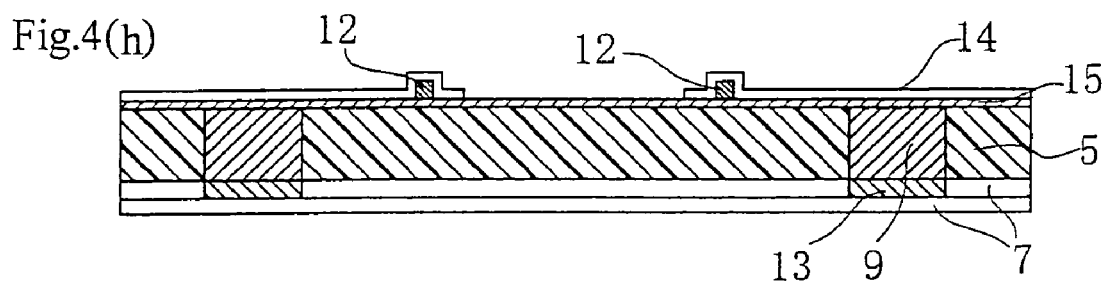
Figure 4I:
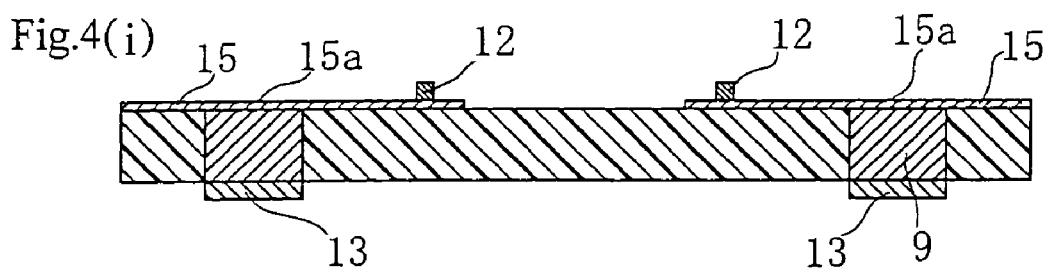

(9) Next, unnecessary portions of the copper foil 6 are removed by etching to form a wiring pattern 15. In this process, a photoresist layer 14 is first formed by electrodeposition, for example, with the first conductive bump 12 for mounting the semiconductor chip and the copper foil 6 being covered (as shown in FIG. 4(g)), and the photoresist layer is exposed and developed along a predetermined circuit pattern (as shown in FIG. 4(h)). Next, the copper foil 6 not protected with the photoresist layer 14 is etched to form a predetermined wiring pattern 15 (as shown in FIG. 4(i)), and then the photoresist layer 14 is removed.

The etchant for the above etching should desirably be at least one selected from sulfuric acid-hydrogen peroxide, persulfate, cupric chloride and ferric chloride aqueous solutions.

A part of the wiring pattern 15 is formed on the conductive pad or connecting land 15a for connection with a conductive bump 26 of the interlayer member 20, which will be described in detail later. The part should preferably has an inside diameter generally equal to that of the viahole and an outside diameter of 50 to 250 μm.

Figure 4J:
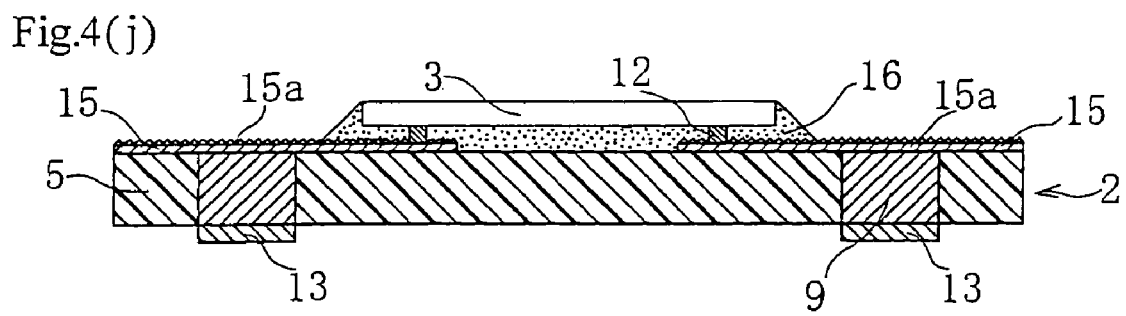

(10) Next, the surface of the wiring pattern 15 formed in the preceding step (9) is matted to form a mattered layer 17, then the PET film 7 is separated from the side of the insulating resin substrate opposite to the copper foil-attached side, and an adhesive layer 18 is formed on the side from which the PET film 7 has been separated. Here the production of the semiconductor chip mounting wiring board 2 is complete (as shown in FIG. 4(j)).

The above matting process is intended to improve the adhesion with the adhesive layer formed on the interlayer member and prevent delamination during stacking.

The above surface matting process is done by soft etching, blackening (oxidizing) and reduction, forming a plating acicular alloy of copper, nickel and phosphorus (INTERPLATE (trade name) by Ebara Yugilite Co., Ltd) or by etching with an etching solution (MECH ETCHBOND (trade name) by Mech Corporation).

In this embodiment, the matted layer should preferably be formed using an etchant. For example, the matted layer can be formed by etching the surface of the wiring pattern with an etchant comprising a mixed aqueous solution of cupric complex and organic acid. The etchant permits to dissolve the copper wiring pattern by spraying or bubbling in the presence of oxygen and is estimated to react as follows:

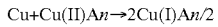

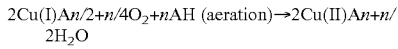

where A denotes a complexing agent (acts as a chelating agent) and n denotes a coordination number.

As shown above, a produced cuprous complex is dissolved under the action of acid, combines with oxygen to produce cupric complex which contributes to oxidation of the copper. The cupric complex used in the present invention should be of the azole class. The etchant comprising the organic acid-cupric complex can be prepared by solving the cupric complex of the azole class and organic acid (halogen ion as necessary) in water.

The above etchant comprises, for example, 10 parts by weight of imidazole copper (II) complex, 7 parts by weight of glycollic acid and 5 parts by weight of potassium chloride.

The semiconductor chip mounting wiring board 2 according to the present invention is produced following the aforementioned procedure consisting of the steps (1) to (10). As shown in FIG. 4(j), the semiconductor chip 3 is secured with an adhesive 16 in the middle of the mounting wiring board 2, and output terminals 3a of the semiconductor chip 3 is embedded in the first conductive bump 12 and thus electrically connected to the wiring pattern 15.

Figure 5:
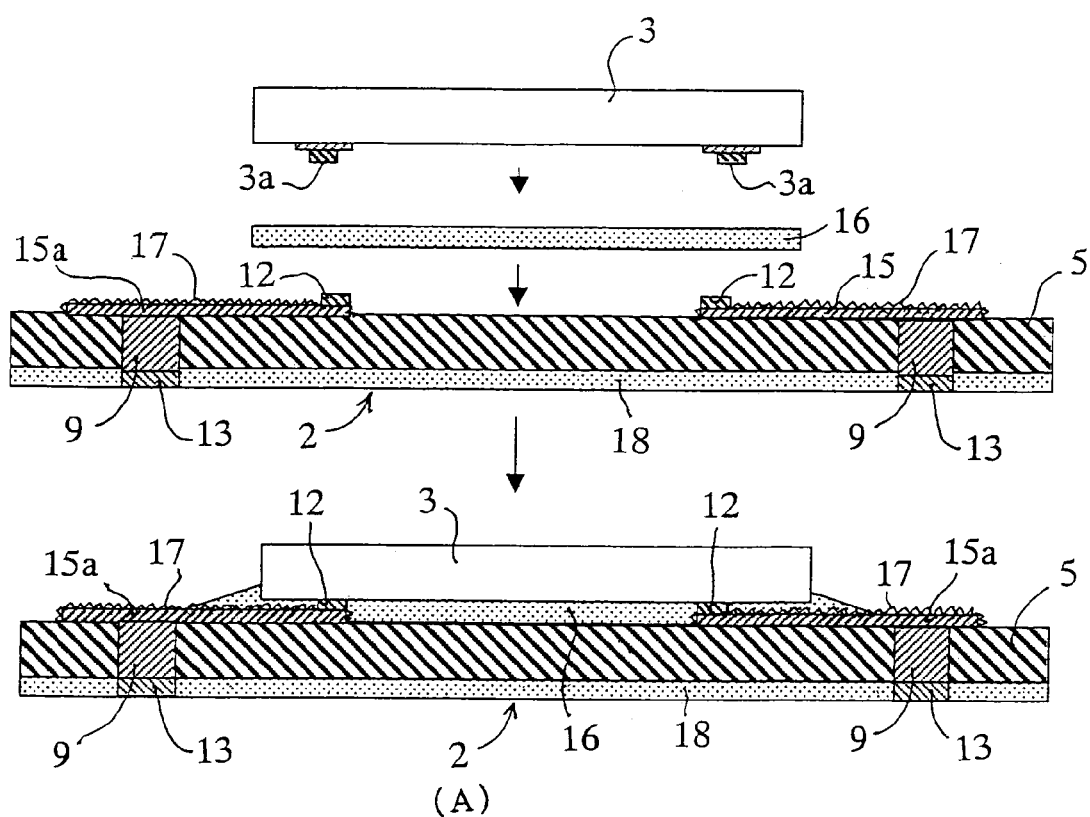
FIG. 5 outlines how to mount the semiconductor to the mounting wiring board.

To mount the semiconductor chip 3 on the first conductive bump 12, a sealing resin sheet 16 is interposed between the mounting wiring board 2 and semiconductor chip 3 as shown in FIG. 5 for example, the output terminal 3a of the semiconductor chip 3 is joined to the first conductive bump 12 in a hot atmosphere. Thus the output terminal 3a and first conductive bump 12 are electrically connected to each other, the space between the semiconductor chip 3 and mounting wiring board 2 is sealed with the resin sheet 16, and thus the semiconductor chip 3 is mounted on the mounting wiring board 2.

Next, an example of the method of producing the interlayer member 20 to be stacked on the above semiconductor chip mounting wiring board will be described with reference to FIGS. 6(a) to 6(f).

Figure 6A:
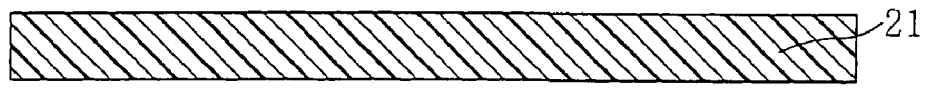
FIGS. 6(a) to 6(f) show a part of the process of producing the interlayer member stacked on or below the semiconductor chip mounting wiring board according to the first embodiment of the present invention.

(1) The starting material for the interlayer member 20 is a rigid insulating resin substrate 21 similar to that of the semiconductor chip mounting wiring board 2 (as shown in FIG. 6(a)).

To receive the semiconductor chip 3 in a central opening 27 which will further be described later, the thickness of the insulating resin substrate 21 is somewhat larger than the height from the top of the semiconductor chip mounting wiring board 2 to the top of the semiconductor chip 3, for example, 130 μm, and the areas of the top and bottom surfaces of the insulating resin substrate 21 are nearly equal to that of the mounting wiring board 2 which is to be opposite to the interlayer member 20 for stacking.

Figure 6B:
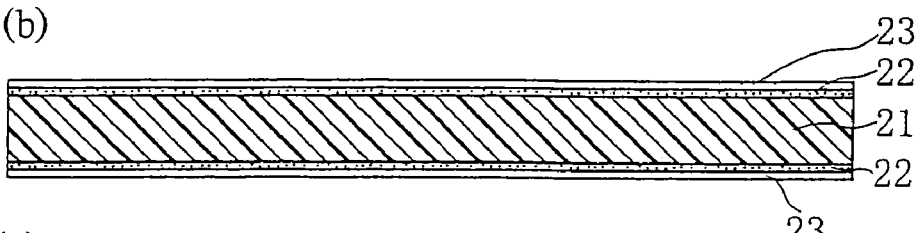
Figure 6C:
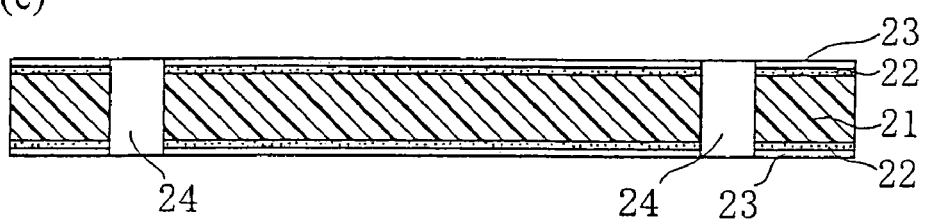

(2) Next, an adhesive layer 22 is formed on either side of the insulating resin substrate 21, and a PET film 23 is attached to the upper adhesive layer 22 to protect the latter (as shown in FIG. 6(b)). Thereafter, for example, a pulse oscillation type carbon dioxide gas laser beam machine is used to irradiate a laser beam from above the PET film 23 to positions corresponding to a connecting land or conductive pad 15a for a semiconductor chip mounting wiring board 2 and a second conductive bump 13 to form a through-hole 24 in the direction of the thickness of the insulating resin substrate 21 (as shown in FIG. 6(c)).

Figure 6D:
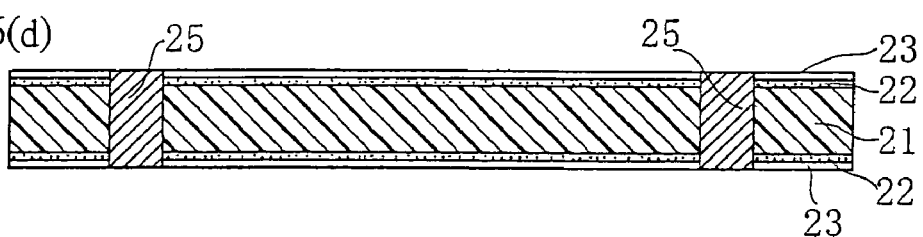
Figure 6E:
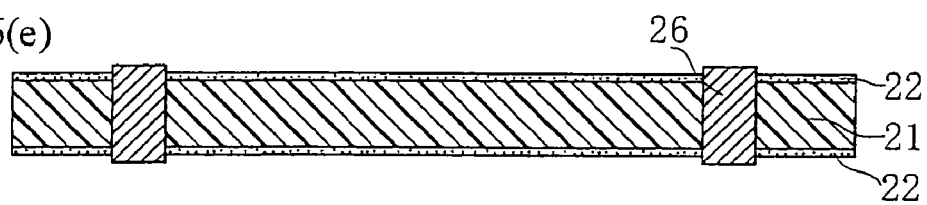

(3) A conductive paste 25 is filled into the through-hole 24 (as shown in FIG. 6(d)). The conductive paste 25 is filled from both the front and rear sides of the insulating resin substrate 21 by screen printing for example. Thereafter, the PET film 23 is separated, resulting in a conductive post 26 projecting from each side of the adhesive layer 22 to a height corresponding to the thickness of the PET film 23 (as shown in FIG. 6(e)).

Figure 6F:
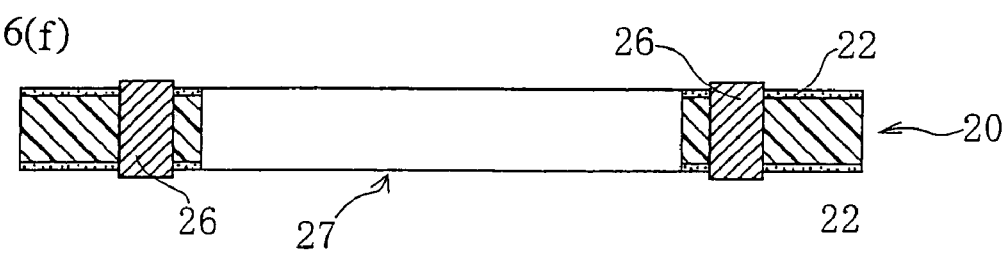

(4) Finally, an opening 27 having a sufficient size to receive the semiconductor chip 3 is formed in the center of the insulating resin substrate 21 by irradiation of a laser beam, for example. Here, the production of the interlayer member 20 is complete (as shown in FIG. 6(f)).

Figure 7A:
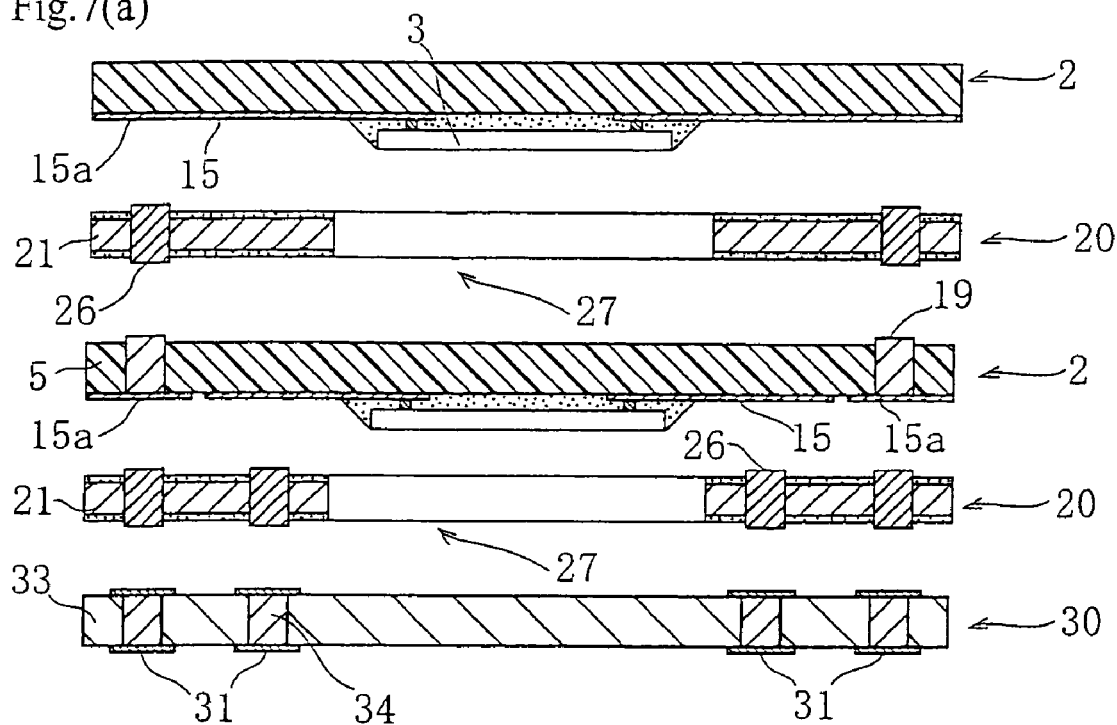
FIG. 7(a) is a perspective view of the semiconductor chip mounting wiring board according to the first embodiment of the present invention, interlayer member and I/O wiring board, stacked on each other.

The semiconductor chip mounting wiring boards 2 and interlayer members 20, having been produced as above, are stacked alternately on one another (as shown in FIG. 7(a)). At this time, a semiconductor chip mounting wiring board 2 having no viaholes formed therein is laid as an uppermost layer with the side thereof on which the semiconductor chip 3 is mounted being directed downward, an interlayer member 20 is laid under the mounting wiring board 2, a semiconductor chip mounting wiring board 2 having viaholes formed therein is laid under the interlayer member 20, an interlayer member 20 is laid under the conductor chip mounting wiring board 2, and an I/O wiring board 30 is laid as a lowermost layer.

When the components of the semiconductor module are stacked on one another as above, the semiconductor chip 3 pre-mounted and secured to the uppermost semiconductor chip mounting wiring board 2 is received in the opening 27 in the interlayer member 20 opposite to the semiconductor chip mounting wiring board 2, the upper projecting end of the conductive post 26 is opposed to the interconnecting land 15a of the semiconductor chip mounting wiring board 2, and the lower projecting end of the conductive post 26 is opposed to the second conductive bump 13 of the underlying semiconductor chip mounting wiring board 2. Further, the upper projecting end of the conductive post 26 of the interlayer member 20 is opposed to the connecting land 15a of the overlaying semiconductor chip mounting wiring board 2 while the lower projecting end thereof is opposed to the conductive pad 31 of the underlying I/O wiring board 30 as the lowermost layer.

Note that the I/O wiring board 30 includes an insulating resin substrate 33 having viaholes 34 formed in predetermined positions therein and a predetermined wiring circuit (not shown) and conductive pads 31 formed on either side thereon.

Figure 7B:
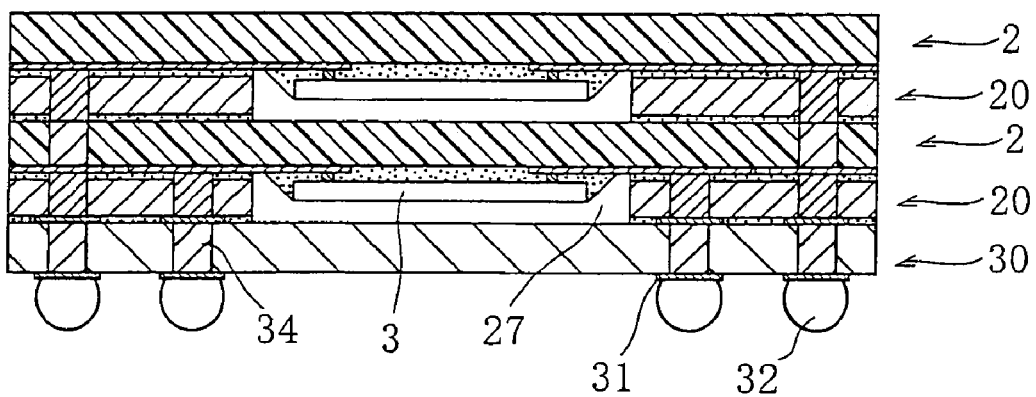
FIG. 7(b) is a sectional view of the semiconductor module produced by applying hot-pressing to the stack shown in FIG. 7(a).

Next, the semiconductor chip mounting wiring boards 2, interlayer members 20 and I/O wiring board 30, having been stacked in the aforementioned geometry, are pressed together while being heated in a vacuum. The adhesive layers 22 on the interlayer member 20 are hardened and thus secured to the upper and lower semiconductor chip mounting wiring boards 2 and I/O wiring board 30. Thus, the semiconductor module 1 is formed (as shown in FIG. 7(b)).

At this time, the wiring pattern 5 on the semiconductor chip mounting wiring board 2 as the uppermost layer is electrically connected to the wiring pattern on the underlying semiconductor chip mounting wiring board 2 by the conductive posts 26 formed on the adjacent interlayer member 20 and also to the wiring pattern on the I/O wiring board 30 by the conductive posts 26 formed on the underlying interlayer member 20.

Also, on lands 31 on the lower side of the I/O wiring board 30, there are formed solder balls 32 for connection with an external wiring board.

In the above embodiment, to form the conductive posts 26 on the interlayer member 20, the adhesive layer 22 is first formed on either side of the insulating resin substrate 21 and the protective film 23' is attached to the adhesive layer 22. Thereafter, the through-holes 24 are formed in predetermined positions through the protective film 23, adhesive layer 22 and interlayer member 20 by laser beam machining, the conductive paste 25 is filled into the through-holes 24, and then the protective film 23 is separated from the adhesive layer 22. Thus, the conductive posts 26 are formed to project from the surface of the adhesive layer 22 for the thickness of the protective film 23, so that when stacking the interlayer members 20 along with the semiconductor chip mounting wiring boards 2 and I/O wiring board 30, the existence of the adhesive layer 22 will not inhibit the contact between the conductive pad 15a of the semiconductor chip mounting wiring board 2 and conductive post 26 of the interlayer member 20 and that between the conductive pad 31 of the I/O wiring board 30 and conductive post 26 of the interlayer member 20. Therefore, the connection between the conductive pad and conductive post will be more reliable.

In the above embodiment, two semiconductor chip mounting wiring boards 2 and two interlayer members 20 are stacked alternately on one another, and the I/O wiring board 30 is stacked on the lower interlayer member 20 to provide a five-layer semiconductor module. However, the number of layers in the semiconductor module is not limited to five but a semiconductor module having six or more layers can of course be produced correspondingly to the size, quantity, insulating resin substrate type and thickness or the like of the semiconductor chips to be mounted.

Further, the semiconductor module according to the present invention is not limited to any stacked state but at least the semiconductor chip mounting wiring boards 2 and interlayer members 20, according to the present invention, may be stacked on one another and an I/O wiring board of another type may be additionally attached to the stack of the semiconductor chip mounting wiring boards and interlayer members according to the present invention.

Next, embodiments of the semiconductor module according to the present invention will be described in more detail.

Embodiment 1

(1) A glass fabric was impregnated with epoxy resin to prepare a B-stage prepreg. A copper foil was attached to the prepreg. They were pressed while being heated to prepare a one-side copper-clad laminate 4. This one-side copper-clad laminate 4 was used as the starting material for the semiconductor chip mounting wiring board 2. The insulating resin substrate 5 was 75 μm thick and copper foil 12 was 12 μm thick (as shown in FIG. 3(a)).

(2) A PET film 7 having a thickness of 22 μm was attached to the side of the insulating resin substrate 5 opposite to the side to which the copper foil 6 was attached. The PET film 7 comprised an adhesive layer of 10 μm in thickness and PET film base of 12 μm in thickness.

(3) Next, a pulse oscillation type carbon dioxide gas laser machine was used to irradiate a laser beam from above the PET film 7 to the insulating resin substrate 5 under the following laser beam machining conditions to form the opening 8 in which the viahole was to be formed, and then the insulating resin substrate 5 was plasma-cleaned to remove resin pieces remaining on the inner wall of the opening 8 (as shown in FIG. 3(b)).

Laser Beam Machining Conditions:

| | |
|---|---|
| Pulse energy | 0.5 to 100 mJ |
| Pulse width | 1 to 100 μs |
| Pulse interval | 0.5 ms or more |
| Number of shots | 3 to 50 |

(4) Next, a PET film 7 was attached as an etching protective film to the copper foil-attached side of the insulating resin substrate 5, and then the insulating resin substrate 5 was applied with electrolytic copper plating in an electrolytic plating solution whose composition was as follows under the following conditions to fill electrolytic copper into the opening 8 and thus form viaholes 9 of 150 μm in diameter and whose inter-viahole distance is 500 μm.

Electrolytic Plating Solution:

| | |
|---|---|
| Sulfuric acid | 180 g/l |
| Copper sulfate | 80 g/l |
| Additive (Karapacid GL by Adotec Japan) | 1 ml/l |

Electrolytic Plating Conditions:

| | |
|---|---|
| Current density | 2 A/dm$^2$ |
| Time | 30 min |
| Temperature | 25° C. |

Next, the insulating resin substrate 5 was applied with electrolytic tin plating under the following plating conditions using an electrolytic plating solution which composition was as follows to fill electrolytic tin in the opening formed in the PET film 7 and thus form, on the viahole 8, the second conductive bump 13 of 150 μm in diameter, 5 μm in height and 500 μm in inter-bump distance (pitch) (as shown in FIG. 3(c)).

Electrolytic Plating Solution:

| | |
|---|---|
| Sulfuric acid | 105 ml/l |
| Tin sulfate (SnSO$_4$) | 30 g/l |
| Additive | 40 ml/l |

Electrolytic Plating Conditions:

| Current density | 2 A/dm² |
|---|---|
| Time | 20 min |
| Temperature | 25° C. |

(6) After the PET film 7 was separated from the copper foil 6 on the insulating resin substrate 5, a PET film 7 was additionally attached to the side of the insulating resin substrate 5 opposite to the copper foil-attached side. Then, a plating photoresist layer 10 having an opening 11 formed therein was formed on the side of the insulating resin substrate 5, to which the copper foil 6 was attached (as shown in FIG. 3(d)). The insulating resin substrate 5 was applied with electrolytic tin plating under the following conditions using the electroplating solution whose composition was as follows to fill the electrolytic tin into the opening 11 and thus form, on the copper foil 6, the first conductive bump 12 of 80 μm in diameter (bump diameter), 20 μm in height and 140 μm in inter-bump distance (pitch) (as shown in FIG. 3(e)).

Electrolytic Plating Solution:

| Sulfuric acid | 105 ml/l |
|---|---|
| Tin sulfate (SnSO₄) | 30 g/l |
| Additive | 40 ml/l |

Electrolytic Plating Conditions:

| Current density | 4 A/dm² |
|---|---|
| Time | 50 min |
| Temperature | 25° C. |

(7) Next, after the plating photoresist layer 10 was removed (as shown in FIG. 4(f)), unnecessary parts of the copper foil 6 were removed by etching to form the predetermined wiring pattern 15.

In the above step, the insulating resin substrate 5 was coated with a photoresist layer 14 by electrodeposition with the copper foil-attached side thereof being covered (as shown in FIG. 4(g)), and then it was exposed and developed along a predetermined circuit pattern (as shown in FIG. 4(h)).

Thereafter, the portions of the copper foil 6 not covered with the photoresist layer 14 were etched to form the predetermined wiring pattern 15, and then the photoresist layer 14 was removed (as shown in FIG. 4(i)).

The wiring pattern 15 was formed by etching with at least any one selected from sulfuric acid-hydrogen peroxide, persulfate, cupric chloride and ferric chloride aqueous solutions.

(8) Next, the surface of the wiring pattern 15 was matted with the etchant to form the matted layer 17, and then the PET film 7 was separated from the side of the insulating resin substrate 5 opposite to the copper foil-attached side. Thus the semiconductor chip mounting wiring board 2 was prepared (as shown in FIG. 4(j)).

(9) A sealing resin sheet was placed between the semiconductor chip mounting wiring board 2 finished in the step (8) above and semiconductor chip 3. In this condition, the semiconductor chip 3 was surface-mounted on the first conductive bump 12 by potting to prepare the semiconductor chip mounting wiring board (as shown in FIG. 5).

(10) Next, a glass fabric-epoxy rein substrate of 130 μm in thickness was shaped into a plate which is an insulating resin substrate 21. An adhesive layer 22 of 15 μm in thickness was formed on either side of the insulating resin substrate 21, and a protective film 23 of 23 μm in thickness was additionally formed on the adhesive layer 22, and then a pulse oscillation type carbon dioxide gas laser beam machine was used to irradiate a laser beam to the insulating resin substrate 21 under the following laser beam machining conditions to form cylindrical through-holes 24 of 100 μm in diameter through the protective film 23, adhesive layer 22 and insulating resin substrate 21 (as shown in FIGS. 6(a) to 6(c)).

Laser Beam Machining Conditions:

| Pulse energy | 0.5 to 100 mJ |
|---|---|
| Pulse width | 1 to 100 μs |
| Pulse interval | 0.5 ms or more |
| Number of shots | 3 to 50 |

(11) Then, to remove resin pieces remaining on the inner wall of the through-hole 24 formed in the step (10), the insulating resin substrate 21 was applied with desmearing process using the plasma discharge, and then was applied with screen printing using a metal mask to fill a conductive paste 25 containing mainly Cu particles into the through-holes 24 (as shown in FIG. 6(d)).

Thereafter, with the protective film 23 separated from the adhesive layer 22, the conductive posts 26 projecting from the surface of the adhesive layer 22 for the thickness of the protective film 23 were formed on both the upper and lower sides of the insulating resin substrate 21 (as shown in FIG. 6(e)).

(12) Finally, an opening 27 to receive the semiconductor chip 3 nearly in the center of the insulating resin substrate was formed by the same laser beam machining. Thus, the interlayer member 20 was finished (as shown in FIG. 6(f)).

(13) Next, two semiconductor chip mounting wiring boards 2 and two interlayer members 20 were stacked alternately on one another, and a prefabricated I/O wiring board 30 was attached to outside the interlayer member 20 as the lowermost layer (as shown in FIG. 7(a)). Then, they were pressed under a pressure of 2 MPa while being heated at a temperature of 180° C. to integrate all the wiring boards by one press-molding.

(14) A nickel-gold layer (not shown) was formed on the conductive pad 31 of the I/O wiring board 30 as the lowermost layer of the stack formed in the step (13) above, and there was formed on each nickel-gold layer a solder ball 32 for connection with the terminal of a mother board. Thus, a semiconductor module 1 having the BGA structure was finished (as shown in FIG. 7(b)).

Embodiment 2

(1) By conducting processes as in the steps (1) to (9) for the embodiment 1, a mounting wiring board 2 having a semiconductor chip 3 mounted thereon was prepared (as shown in FIGS. 3(a) to 4(e)).

Figure 8A:
FIGS. 8(a) to 8(f) show a part of the process of producing the interlayer member used in a second embodiment of the present invention.

(2) Next, a glass fabric was impregnated with epoxy resin. The glass fabric thus processed was heated to a semi-hardened state, and then shaped to be a plate which was a prepreg of 150 μm in thickness. The prepreg was used as the insulating resin substrate 21 for the interlayer member 20 (as shown in FIG. 8(a)).

Figure 8B:
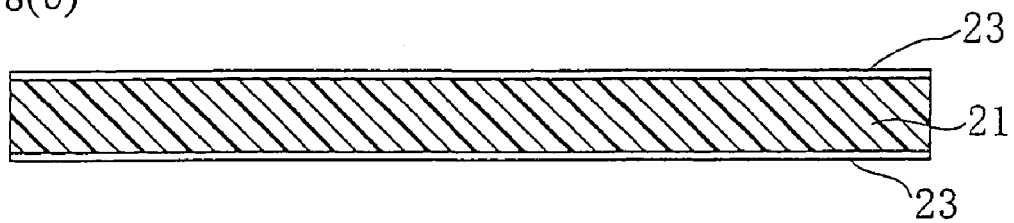
Figure 8C:
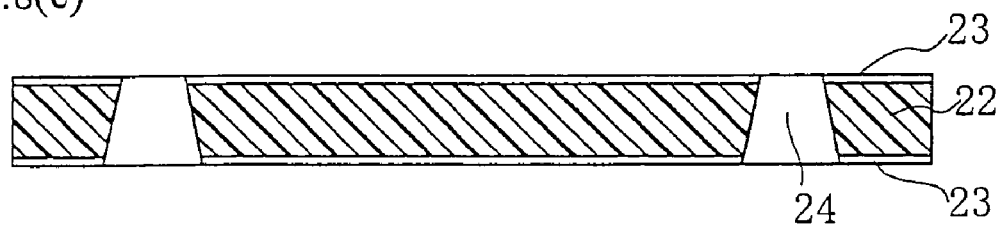
Figure 8D:
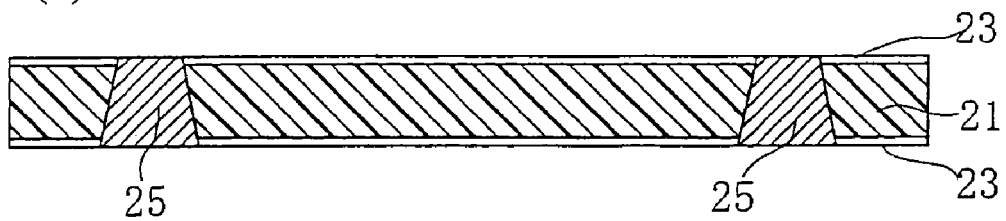
Figure 8E:
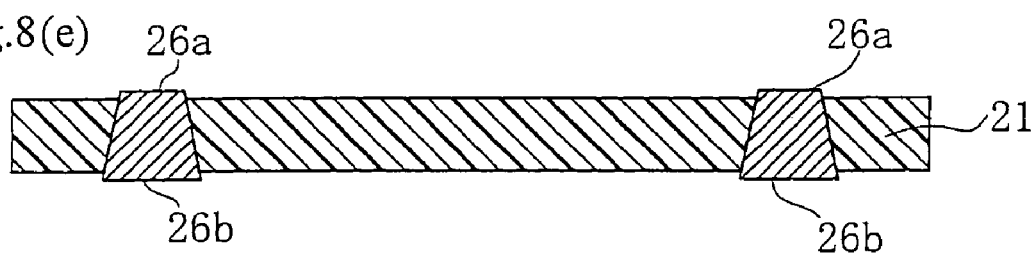
Figure 8F:
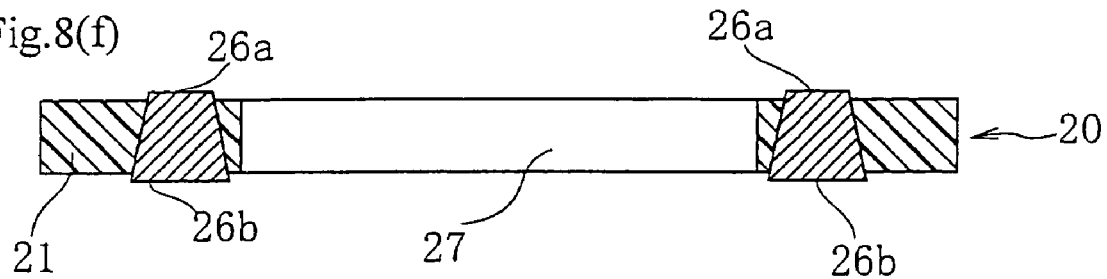

A protective film 23 of 23 μm in thickness was attached to either side of the insulating resin substrate 21 formed from the prepreg (as shown in FIG. 8(b)). A pulse oscillation type carbon dioxide gas laser machine was used to irradiate a laser beam from below the insulating resin substrate 21 under the following conditions to form a truncated-conical through-hole 24 having a diameter of 250 μm at the lower opening and a diameter of 100 μm at the upper opening (as shown in FIG. 8(*c*)).

Laser Beam Machining Conditions:

| | |
|---|---|
| Pulse energy | 0.5 to 100 mJ |
| Pulse width | 1 to 100 μs |
| Pulse interval | 0.5 ms or more |
| Number of shots | 3 to 50 |

(3) The insulating resin substrate 21 was applied with screen printing with a metal mask placed on the protective film 23 to fill a conductive paste 25 containing mainly Cu particles into the through-holes 24 formed in the step (2) above (as shown in FIG. 8(*d*)). Thereafter, the protective film 23 was separated. The conductive posts 26 (projections 26*a* and 26*b*) projecting from the surface of the adhesive layer 22 for the thickness of the protective film 23 were formed on the upper and lower sides of the insulating resin substrate 21 (as shown in FIG. 8(*e*)). The diameters of the projections 26*a* and 26*b* of the conductive post 26 were generally equal to the diameters of the truncated-conical through-hole 24. Namely, the upper projection 26*a* was formed smaller than the lower projection 26*b*.

(4) Finally, the same laser beam machining was applied to form an opening 27 to receive the semiconductor chip 3 nearly in the center of the insulation resin substrate 21. Thus, the interlayer member 20 was finished (as shown in FIG. 8(*f*)).

(5) Thereafter, by conducting processes as in the steps (13) to (14) for the first embodiment, a semiconductor module 1 having the BGA structure was finished (as shown in FIGS. 9(*a*) and 9(*b*)).

In the embodiment 2, since the through-hole 24 formed in the interlayer member 20 had the larger diameter at the lower opening thereof than at the upper opening, namely, it was tapered upwardly. Correspondingly, the projection 26*b* at the lower side of the conductive post 26 was larger in diameter than the projection 26*a* at the upper side.

Therefore, the interlayer member 20 was positioned for stacking and applied with host-pressing so that the projection 26*a* of the conductive post 26, having the smaller diameter, could be connected to the conductive pad 15*a* of the overlaying semiconductor chip mounting wiring board 2 and the projection 26*b* having the larger diameter be connected to the second conductive bump 13 of the underlying semiconductor chip mounting wiring board 2. Thus, even if any misregistration is caused during stacking, it can be compensated for and the semiconductor chip mounting wiring board 2 and interlayer member 20 can correctly be connected to each other.

Embodiment 3

(1) By conducting processes as in the steps (1) to (9) for the embodiment 1, a semiconductor chip mounting wiring board 2 was prepared.

(2) Next, as the starting material for the interlayer member 20, an insulating resin substrate 21 formed from a glass fabric-epoxy resin plate was used (as shown in FIG. 10(*a*)).

First, an adhesive layer 22 of 15 μm in thickness was formed on either side of the insulating resin substrate 21 of 130 μm in thickness, a protective film 23 of 23 μm in thickness was additionally attached to the adhesive layer 22 (as shown in FIG. 10(*b*)), and a pulse oscillation type carbon dioxide gas laser beam machine was used to irradiate a laser beam to the insulating resin substrate 21 from below under the following laser beam machining conditions to form a stepped cylindrical through-holes 24 through the protective film 23, adhesive layer 22 and insulating resin substrate 21.

The through-hole 24 consisted of upper and lower portions. The lower portion was a cylindrical concavity 55 having a diameter of 250 μm while the upper portion was a cylindrical through-hole 56 coaxially penetrating from the bottom of the concavity 55 in the direction of the thickness of the insulating resin substrate 21 and having a diameter of 100 μm. Thus, the through-hole 24 had a generally cylindrical stepped form (as shown in FIG. 10(*c*)).

Laser Beam Machining Conditions for Concavity 55:

| | |
|---|---|
| Pulse energy | 5 to 15 mJ or more |
| Pulse width | 1 to 50 μs |
| Pulse interval | 2 ms or more |
| Number of shots | 1 to 2 |

Laser Beam Machining Conditions for Through-Hole 56:

| | |
|---|---|
| Pulse energy | 0.5 to 5 mJ |
| Pulse width | 1 to 20 μs |
| Pulse interval | 2 ms or more |
| Number of shots | 3 to 10 |

(3) Next, to remove resin pieces remaining in the stepped cylindrical through-hole 24 formed in the step (2) above, the insulating resin substrate 21 was applied with desmearing by plasma discharge, at the protective film 23 on the lower side thereof with screen printing to fill a conductive paste 25 containing mainly Ag particles into the through-hole 24, and at the protective film 23 on the upper side thereof with screen printing to similarly fill the conductive paste 25 into the through-hole 24 (as shown in FIG. 10(*d*)).

Thereafter, the protective films 23 were separated. Thus, conductive posts 26 (projections 26*a* and 26*b*) projecting from the surface of the adhesive layer 22 for the thickness of the protective film 23 were formed on each of the upper and lower sides of the insulating resin substrate 21 (as shown in FIG. 10(*e*)).

The diameters of the projections 26*a* and 26*b* of the conductive post 26 corresponded to the diameters of the stepped cylindrical through-hole 24, and the upper projection 26*a* of the conductive post 26 was smaller than the lower projection 26*b*.

(4) Finally, an opening 27 to receive the semiconductor chip 3 was formed nearly in the center of the insulating resin substrate 21 by the same laser beam machining. Thus, the interlayer member 20 was finished (as shown in FIG. 10(*f*)).

Figure 11A:
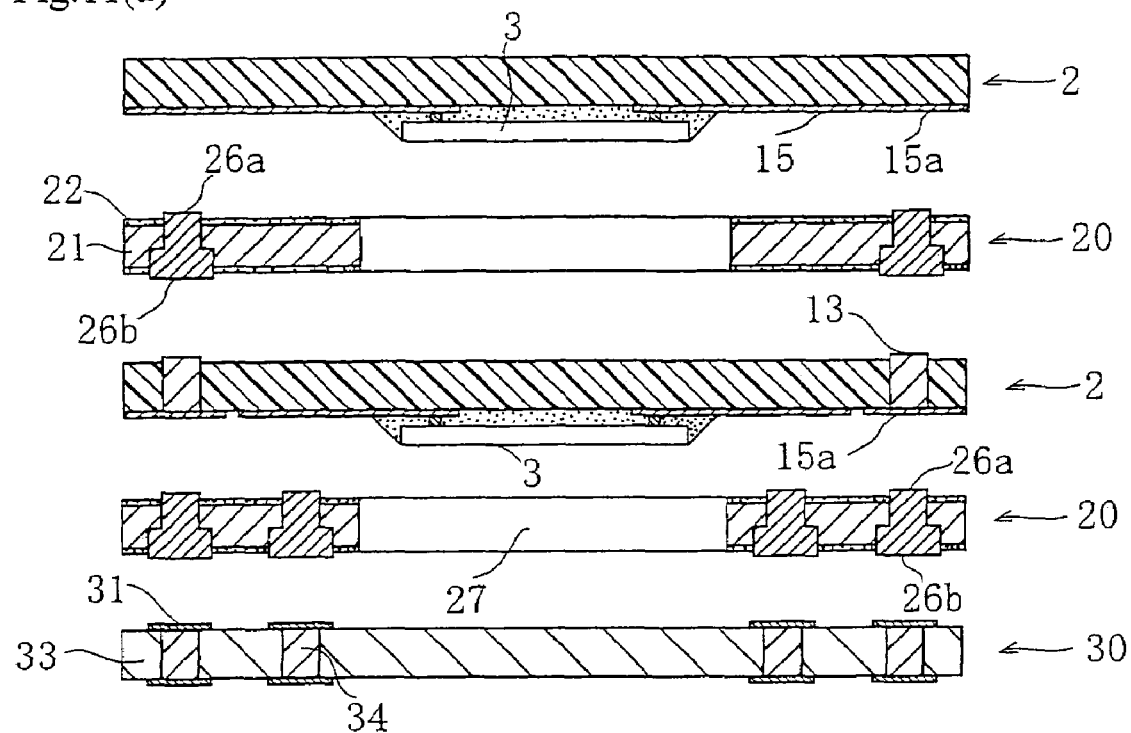
FIG. 11(a) is a perspective view of the semiconductor chip mounting wiring board according to the third embodiment of the present invention, interlayer member and I/O wiring board, stacked on each other.
Figure 11B:
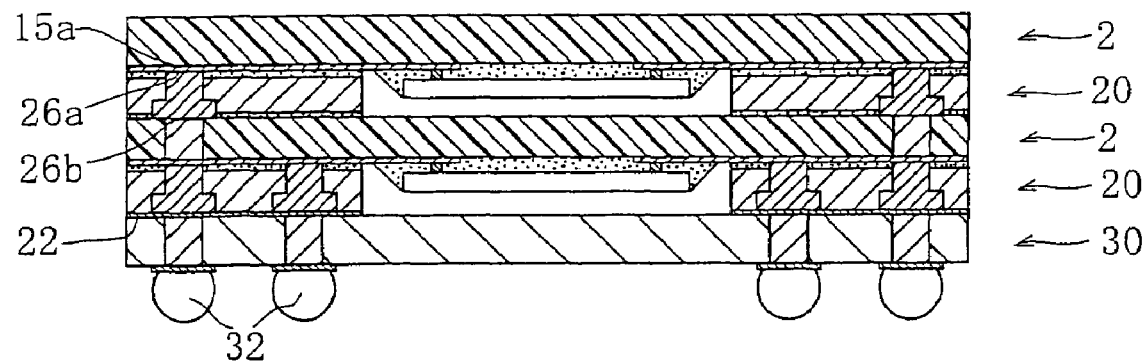
FIG. 11(b) is a sectional view of the semiconductor module produced by applying hot-pressing to the stack shown in FIG. 11(a).

(5) Thereafter, by conducting processes as in the steps (13) to (14) for the embodiment 1, the semiconductor module 1 having the BGA structure was finished (as shown in FIGS. 11(*a*) and 11(*b*)).

In the embodiment 3, the through-hole 24 formed in the interlayer member 20 is shaped to be a stepped cylinder having the inside diameter of the lower opening 55 larger than that of the upper opening 56, so the diameter of the lower projection 26*b* of the conductive post 26 is larger than that of the upper projection 26*a*.

Therefore, as in the embodiment 2, the interlayer member 20 was positioned for stacking and applied with host-pressing so that the projection 26a of the conductive post 26, having the smaller diameter, could be connected to the conductive pad 15a of the overlaying semiconductor chip mounting wiring board 2 and the projection 26b having the larger diameter be connected to the second conductive bump 13 of the underlying semiconductor chip mounting wiring board 2. Thus, even if any misregistration is caused during stacking, it can be compensated for and the semiconductor chip mounting wiring board 2 and interlayer member 20 can correctly be connected to each other.

Embodiment 4

(1) A glass fabric was impregnated with epoxy resin to prepare a B-stage prepreg. A copper foil was attached to the prepreg. They were applied with hot-pressing to prepare a one-side copper clad laminate 4. This one-side copper-clad laminate 4 was used as the starting material for the semiconductor chip mounting wiring board 2. The insulating resin substrate 5 was 40 μm thick and copper foil 12 was 12 μm thick.

(2) A PET film 7 having a thickness of 22 μm was attached to the side of the insulating resin substrate 5 opposite to the copper foil-attached side. The PET film 7 comprised an adhesive layer of −10 μm in thickness and PET film base of 12 μm in thickness.

Figure 12A:
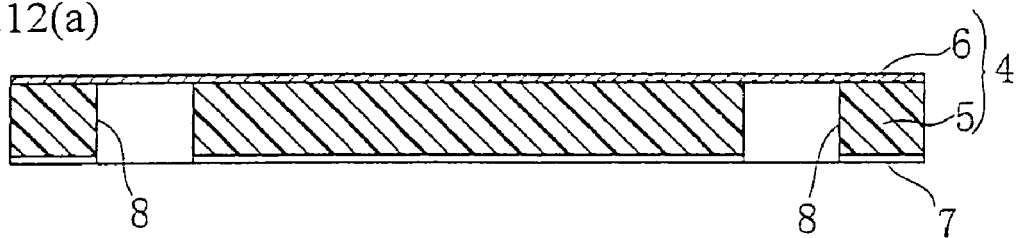
FIGS. 12(a) to 12(e) show a part of the process of producing the semiconductor chip mounting wiring board according to a fourth embodiment of the present invention.

(3) Next, a pulse oscillation type carbon dioxide gas laser machine was used under the following laser beam machining conditions to irradiate a laser beam from above the PET film 7 to the insulating resin substrate 5 to form the opening 8 in which the viahole was to be formed, and then the insulating resin substrate 5 was plasma-cleaned to remove resin pieces remaining on the inner wall of the opening 8 (as shown in FIG. 12(a)).

Laser Beam Machining Conditions:

| Pulse energy | 0.5 to 100 mJ |
| --- | --- |
| Pulse width | 1 to 100 μs |
| Pulse interval | 0.5 ms or more |
| Number of shots | 3 to 50 |

Figure 12B:
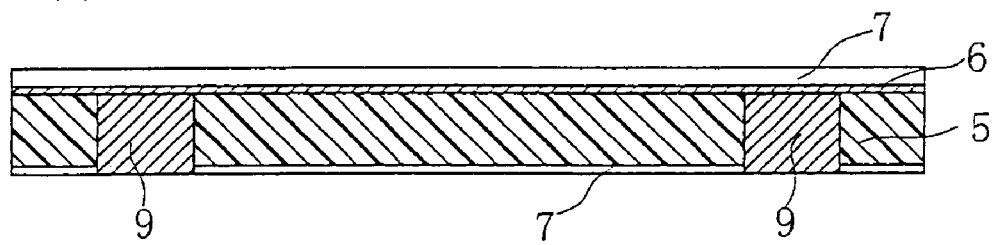

(4) Next, a PET film 7 as an etching protective film was attached to the copper foil-attached side of the insulating resin substrate 5, and then the insulating resin substrate 5 was applied with electrolytic solder plating in an electrolytic plating solution whose composition was as follows under the following conditions to fill electrolytic solder into the opening 8 and thus form viaholes 9 of 150 μm in diameter and whose inter-viahole distance is 500 μm (as shown in FIG. 12(b)).

Electrolytic Solder Plating Solution:

| Sn(BF4)2 | 25 g/l |
| --- | --- |
| Pb(BF4)2 | 12 g/l |
| Additive | 5 ml/l |

Electrolytic Solder Plating Conditions:

| Temperature | 20° C. |
| --- | --- |
| Current density | 0.4 A/dm$^2$ |

Figure 12C:
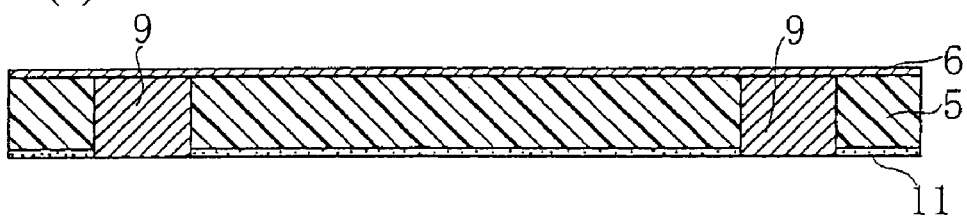

(5) After the PET film 7 was separated from the resin surface of the insulating resin substrate 5 opposite to the side on which the copper foil 6 was attached, an adhesive layer 11 of phenol or epoxy resin was formed over the resin surface of the insulating resin substrate 5, and then the PET film 7 was separated from the copper foil-attached side of the insulating resin substrate 5 (as shown in FIG. 12(c)).

Figure 12D:
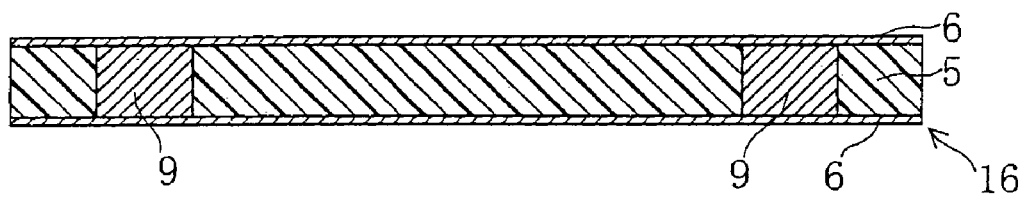

(6) Next, a copper foil 13 of 12 μm in thickness was attached to the adhesive layer 11 under a pressure to form the copper foil 13 on either side of the insulating resin substrate 5 to provide a both-side copper-clad laminate 16 in which the copper foils 13 were electrically connected to each other by the plated metal inside the viaholes 9 (as shown in FIG. 12(d)).

Figure 12E:
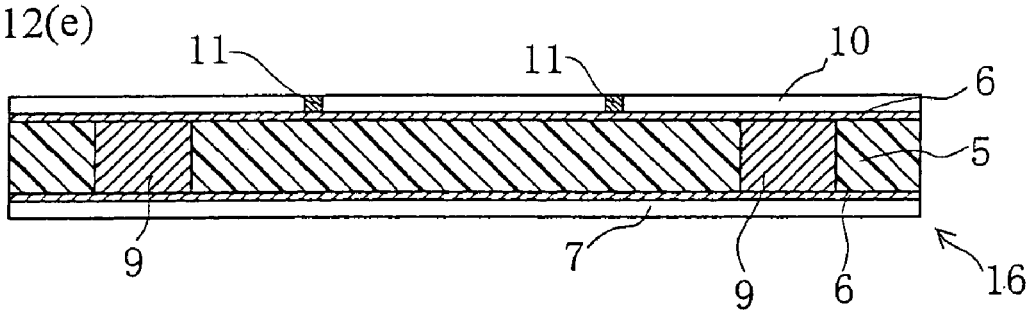

(7) Then, a photosensitive dry film was attached to the upper copper foil 6 on the insulating resin substrate 5, and the latter was subjected to masked exposure and development to form a plating photoresist layer 10 having an opening 11 in which a bump for electrical connection with the semiconductor chip 3 was to be formed (as shown in FIG. 12(e)).

(8) With the protective (PET) film 7 kept attached to the lower copper foil 6 on the insulating resin substrate 5, the latter was applied with electrolytic tin plating under the following conditions to fill the electrolytic tin into the opening 11 formed in the plating photoresist layer 10. Thereafter, the plating photoresist layer 10 was removed and protective film 7 was separated to form, on the copper foil 6, the first conductive bump 12 of 80 μm in diameter (bump diameter), 20 μm in height and 140 μm in inter-bump distance (pitch) (as shown in FIG. 12(f)).

Electrolytic Plating Solution:

| Sulfuric acid | 105 ml/l |
| --- | --- |
| Tin sulfate (SnSO$_4$) | 30 g/l |
| Additive | 40 ml/l |

Electrolytic Plating Conditions:

| Current density | 2 A/dm$^2$ |
| --- | --- |
| Time | 20 min |
| Temperature | 25° C. |

(9) Next, unnecessary parts of the copper foil 6 were removed by etching to form the predetermined wiring pattern 15 on either side of the insulating resin substrate 5.

Figure 13F:
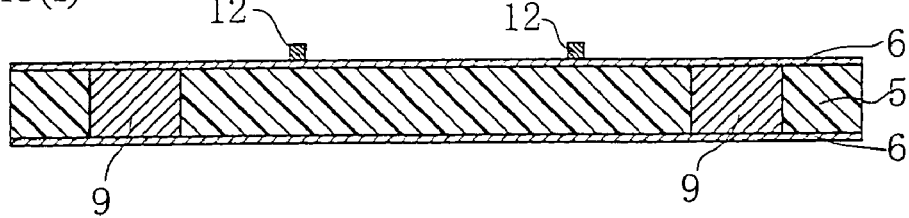
FIGS. 13(f) to 13(j) show a part of the process of producing the semiconductor chip mounting wiring board according to the fourth embodiment of the present invention.
Figure 13G:
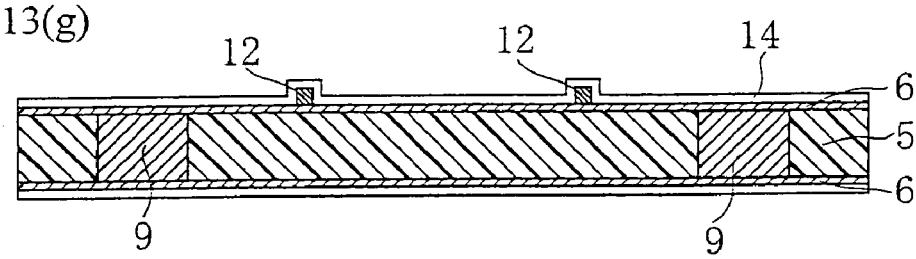
Figure 13H:
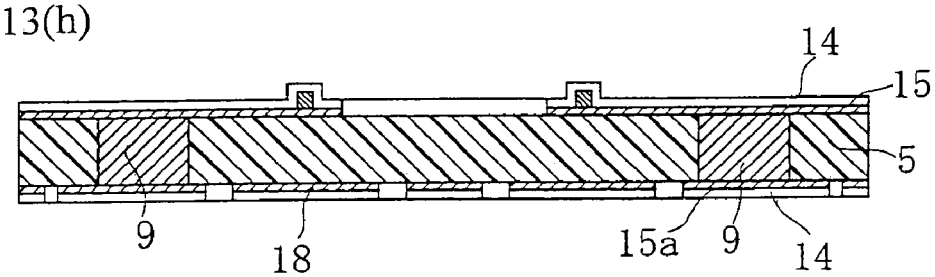
Figure 13I:
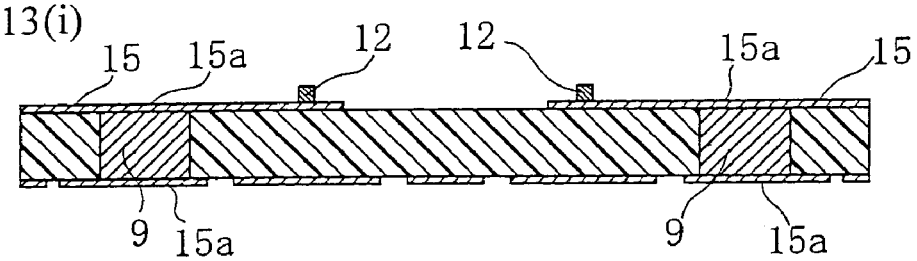
Figure 13J:
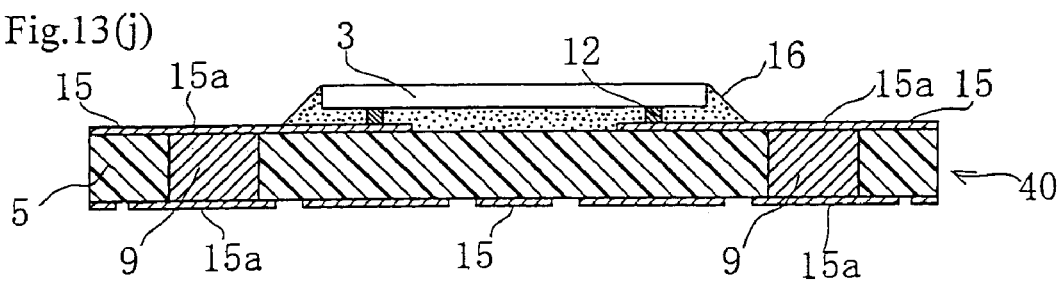

In the above step, the both-side copper-clad laminate 16 was coated with a photoresist layer 14 by electrodeposition, for example, with both sides thereof being covered (as shown in FIG. 13(g)), and then it was exposed and developed along a predetermined circuit pattern (as shown in FIG. 13(h)). Thereafter, the portions of the copper foil 6 not covered with the photoresist layer 14 were etched to form the predetermined wiring pattern 15, and then the photoresist layer 14 was removed (as shown in FIG. 13(i)).

The above etching should desirably be done with at least any one selected from sulfuric acid-hydrogen peroxide, persulfate, cupric chloride and ferric chloride aqueous solutions.

A part of the wiring pattern 15 was formed on a conductive pad or interconnecting land 15a for connection with the conductive post 26 of the interlayer member 20, which will be described in detail later. The inside diameter of the part was nearly the same as that of the viahole while the outside diameter was 250 μm.

(10) Next, the surface of the wiring pattern 15 formed in the above step (9) was matted to form a matted layer. Thus, a semiconductor chip mounting wiring board 40 having the wiring pattern 15 formed on either side thereof was finished.

(11) A sealing resin sheet was placed between the first conductive bump 12 of the semiconductor chip mounting wiring board 40 finished in the step (10) above and semiconductor chip 3. In this condition, the semiconductor chip 3 was surface-mounted on the first conductive bump 12 by potting.

Figure 14A:
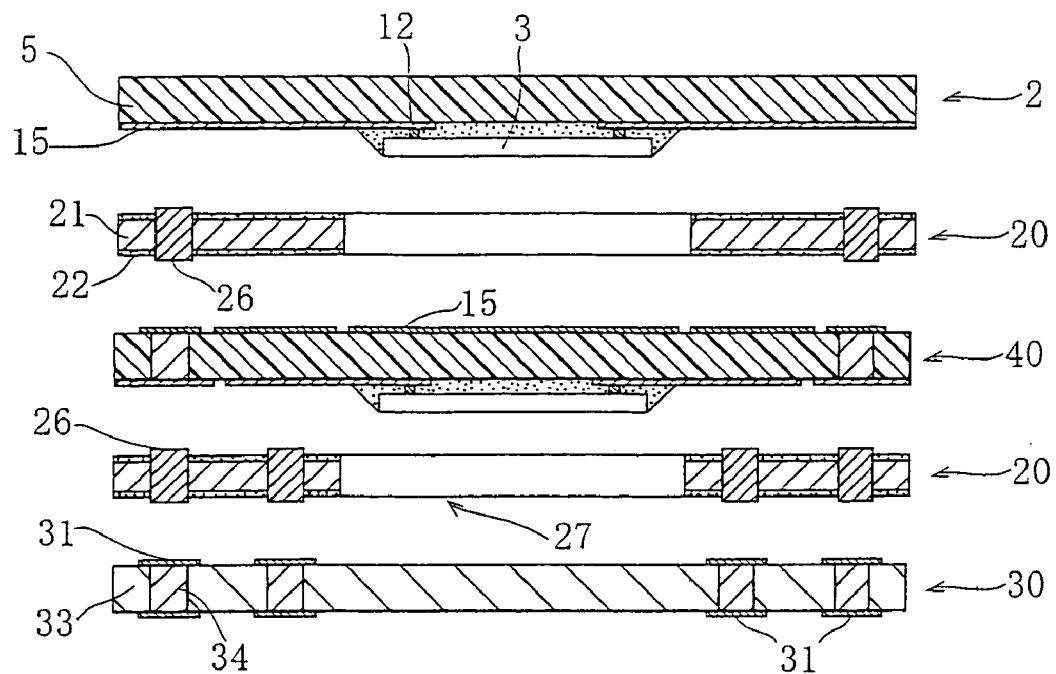
FIG. 14(a) is a perspective view of the semiconductor chip mounting wiring board according to the fourth embodiment of the present invention, interlayer member and I/O wiring board, stacked on each other.
Figure 14B:
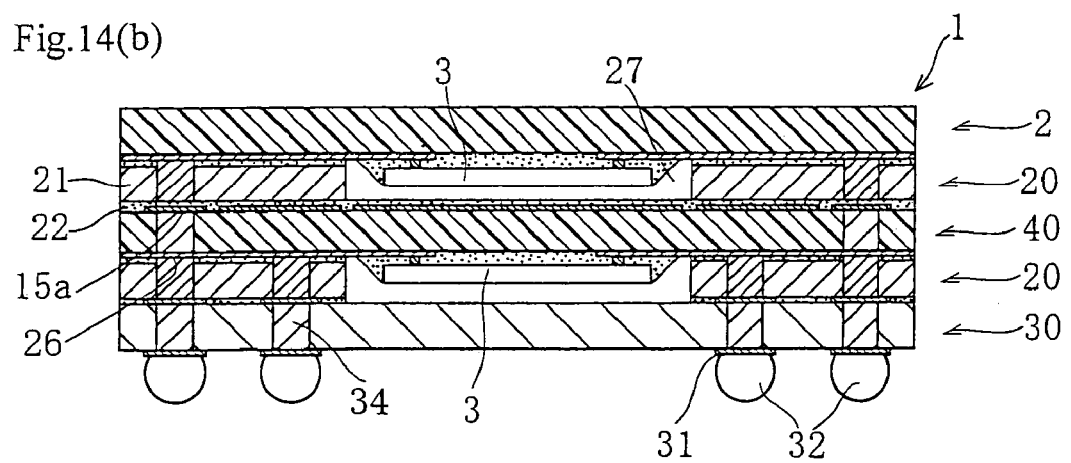
FIG. 14(b) is a sectional view of the semiconductor module produced by applying hot-pressing to the stack shown in FIG. 14(a).

(12) Next, a glass fabric was impregnate with epoxy rein substrate, and heated to a semi-hardened state to form plate which was a prepreg of 130 µm in thickness, which was used as an insulating resin substrate 21 to form an interlayer member 20. Portions of the insulating resin substrate 20 were subjected to processes as in the steps (10) to (14) for the embodiment 1, except for desmearing, to produce a semiconductor module 1 having the BGA structure (as shown in FIGS. 14(a) and 14(b)).

Embodiment 5

The processes for production of the embodiment 5 were similar to those for the embodiment 4 except that electrolytic copper was filled into the opening 8 until the filled electrolytic copper was flush with the surface of the insulating resin substrate 5 and the insulating resin substrate 5 was further applied with electrolytic solder plating to generally cover the electrolytic copper plated surface to form the viahole 9, and that an insulating resin substrate 21 formed from a glass fabric-epoxy resin plate was used as the interlayer member 20. Thus, a semiconductor module 1 having the BGA structure was produced.

According to the aforementioned embodiments 4 and 5, since the semiconductor chip mounting wiring board has formed on one side thereof a wiring pattern including the first conductive bump 12 on which the semiconductor chip 3 was to be mounted, and a wiring pattern formed on the other side, the stacked type semiconductor module can be designed compact and thus a semiconductor module of a low profile and a high mounting density can be provided.

Since a metal whose melting point is lower than that of copper is used as the conductive substance to be filled in the opening in which the viahole is to be formed, the copper foil can be attached, with a high adhesion, to the surface of the insulating resin substrate to cover the viahole metal when forming the wiring pattern on either side of he insulating resin substrate.

Embodiment 6

Figure 15A:
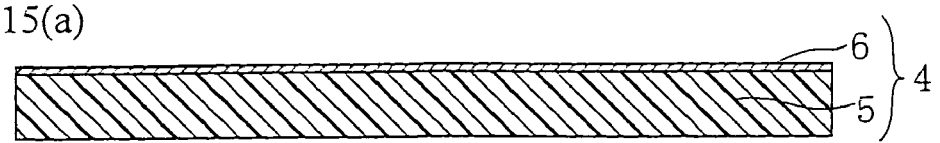
FIGS. 15(a) to 15(e) show a part of the process of producing the semiconductor chip mounting wiring board according to a sixth embodiment of the present invention.

(1) A glass fabric was impregnated with epoxy resin to prepare a B-stage prepreg. A copper foil was attached to the prepreg. They were applied with hot-pressing to prepare a one-side copper-clad laminate 4. This one-side copper-clad laminate 4 was used as the starting material for the semiconductor chip mounting wiring board 2. The insulating resin substrate 5 was 40 µm thick and copper foil 12 was 12 µm thick (as shown in FIG. 15(a)).

Figure 15B:
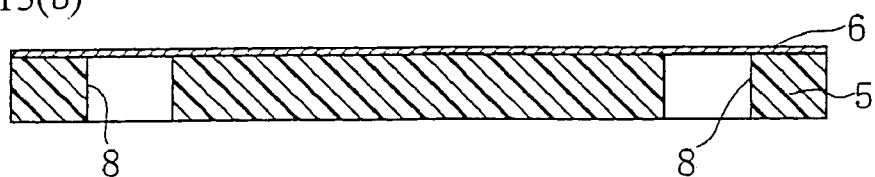

(2) Next, a pulse oscillation type carbon dioxide gas laser machine was used to irradiate a laser beam to the insulating resin substrate 5 from above the resin surface thereof under the following laser beam machining conditions to form the opening 8 in which the viahole was to be formed, and then the insulating resin substrate 5 was plasma-cleaned to remove resin pieces remaining on the inner wall of the opening 8 (as shown in FIG. 15(b)).

Laser Beam Machining Conditions:

| Pulse energy | 0.5 to 100 mJ |
|---|---|
| Pulse width | 1 to 100 µs |
| Pulse interval | 0.5 ms or more |
| Number of shots | 3 to 50 |

(3) Next, a PET film 7 of 22 µm in thickness was attached as an etching protective film to the side of the insulating resin substrate 5, on which the copper foil 6 was attached, and then the insulating resin substrate 5 was applied with electrolytic copper plating in an electrolytic plating solution whose composition was as follows under the following conditions to fill electrolytic copper into the opening 8 and thus form viaholes 9 of 150 µm in diameter and whose inter-viahole distance is 500 µm.

Figure 15C:
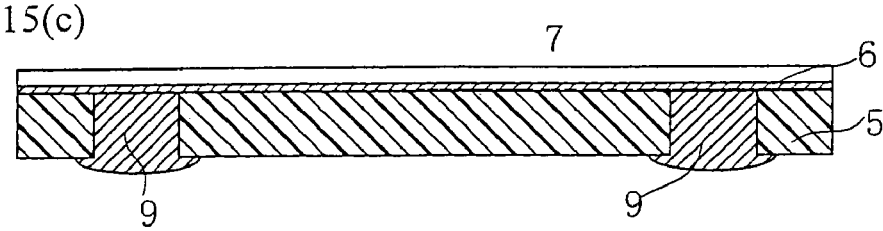

The electrolytic copper was filled in the opening 8 to such an extent that it projected a little from the surface of the insulating resin substrate 5 (as shown in FIG. 15(c)).

Electrolytic Plating Solution:

| Sulfuric acid | 180 g/l |
|---|---|
| Copper sulfate | 80 g/l |
| Additive (Kapapacid GL by Adotec Japan) | 1 ml/l |

Electrolytic Plating Conditions:

| Current density | 2 A/dm$^2$ |
|---|---|
| Time | 35 min |
| Temperature | 25° C. |

Figure 15D:
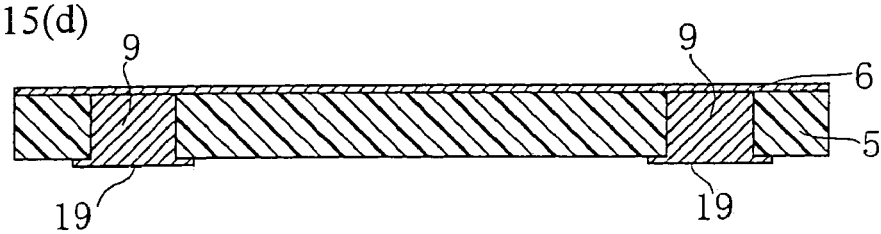

(4) Next, the electrolytic copper-plated portions projecting from the surface of the insulating resin substrate 5 were pressed under a pressure of 0.2 to 0.4 MPa to form a flat interconnecting land 19 beneath the viahole 9 (as shown in FIG. 15(d)).

Figure 15E:
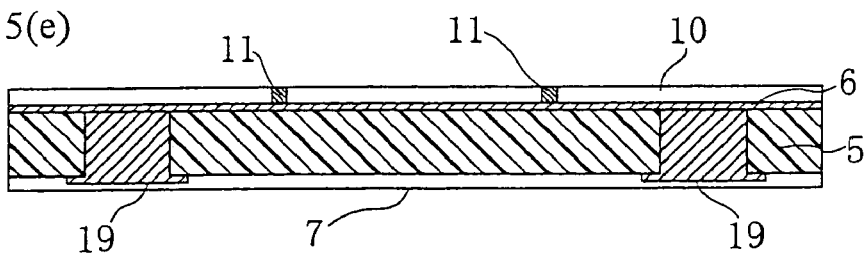
Figure 16F:
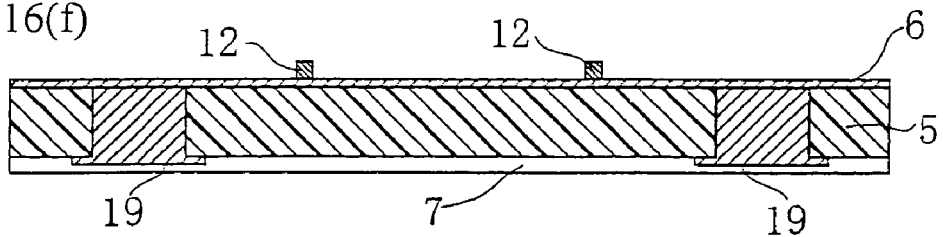
FIGS. 16(f) to 16(j) show a part of the process of producing the semiconductor chip mounting wiring board according to the sixth embodiment of the present invention.
Figure 16G:
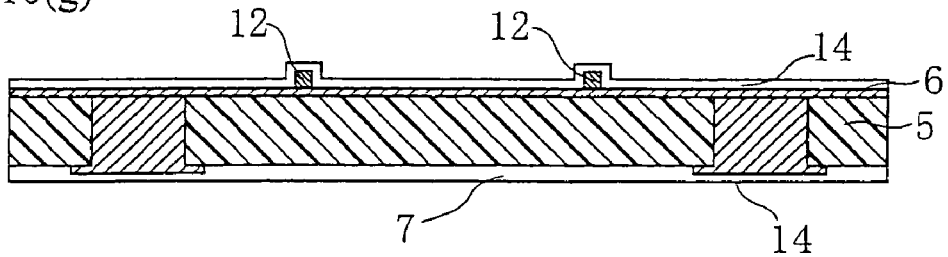
Figure 16H:
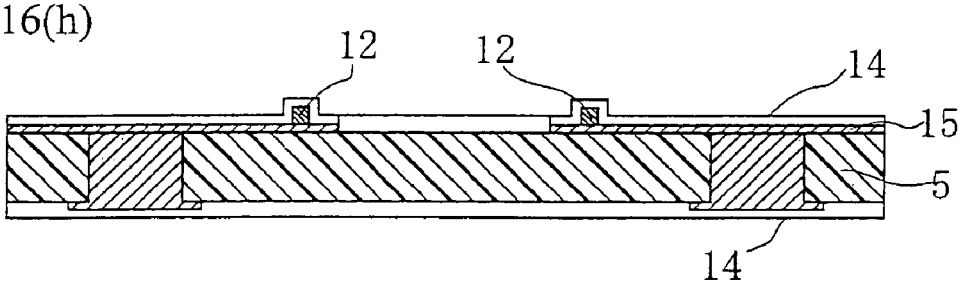
Figure 16I:
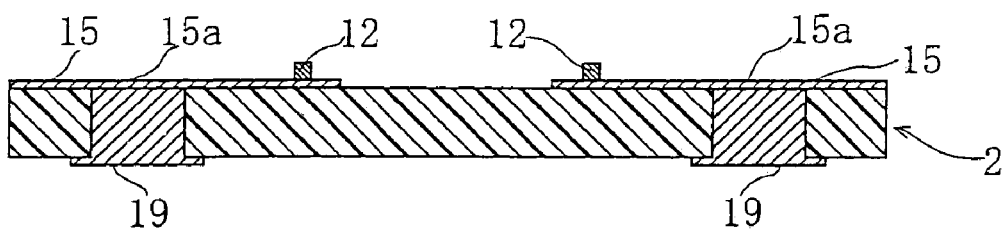
Figure 16J:
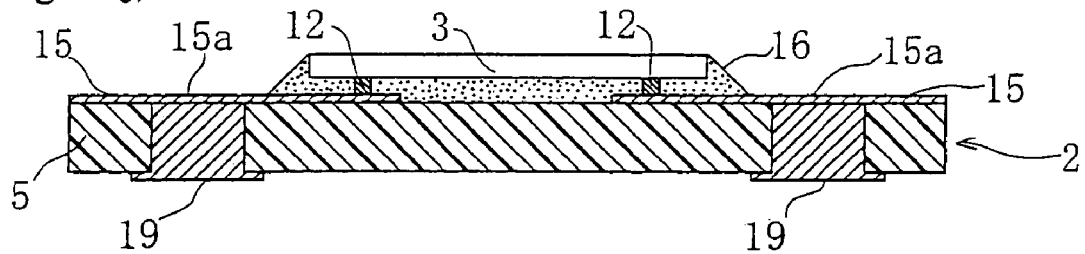

(5) Next, the PET film 7 was separated from the side of the insulating resin substrate 5, to which the copper foil 6 was attached, and then a PET film 7 was additionally attached to the side of the insulating resin substrate 5 opposite to the side to which the copper foil 6 was attached (as shown in FIG. 15(e)). A plating photoresist layer 10 having an opening 11 was formed on the side of the insulating resin substrate, to which the copper foil 6 was attached, and then the insulating resin substrate 5 was applied with electrolytic tin plating under the following plating conditions using an electrolytic plating solution which composition was as follows to fill electrolytic tin in the opening 11 and thus form, on the copper foil 6, the first conductive bump 12 of 80 µm in diameter, 20 µm in height and 140 µm in inter-bump distance (pitch) (as shown in FIG. 16(f)).

Electrolytic Plating Solution:

| Sulfuric acid | 105 ml/l |
|---|---|
| Tin sulfate (SnSO$_4$) | 30 g/l |
| Additive | 40 ml/l |

Electrolytic Plating Conditions:

| Current density | 4 A/dm² |
|---|---|
| Time | 50 min |
| Temperature | 25° C. |

(6) After the plating photoresist layer 10 was removed, unnecessary portions of the copper foil 6 were removed by etching to form a predetermined wiring pattern 15.

In the above step, the insulating resin substrate 5 was coated with a photoresist layer 14 by electrodeposition, for example, with the copper foil-attached side thereof being covered (as shown in FIG. 16(*g*)), and then it was exposed and developed along a predetermined circuit pattern (as shown in FIG. 16(*h*)). Thereafter, the portions of the copper foil 6 not covered with the photoresist layer 14 were etched to form the predetermined wiring pattern 15, and then the photoresist layer 14 was removed (as shown in FIG. 16(*i*)).

The wiring pattern 15 should desirably be formed by etching with at least any one selected from sulfuric acid-hydrogen peroxide, persulfate, cupric chloride and ferric chloride aqueous solutions.

(7) Next, the surface of the wiring pattern 15 was matted with the etchant to form a matted layer (not shown), and then the PET film 7 was separated from the side of the insulating resin substrate 5 opposite to the copper foil-attached side. Thus the semiconductor chip mounting wiring board 2 was prepared.

(8) A sealing resin sheet 16 was placed between the semiconductor chip mounting wiring board 2 finished in the step (7) above and semiconductor chip 3. In this condition, the semiconductor chip 3 was surface-mounted on the first conductive bump 12 by potting to prepare the semiconductor chip mounting wiring board 2.

Figure 17A:
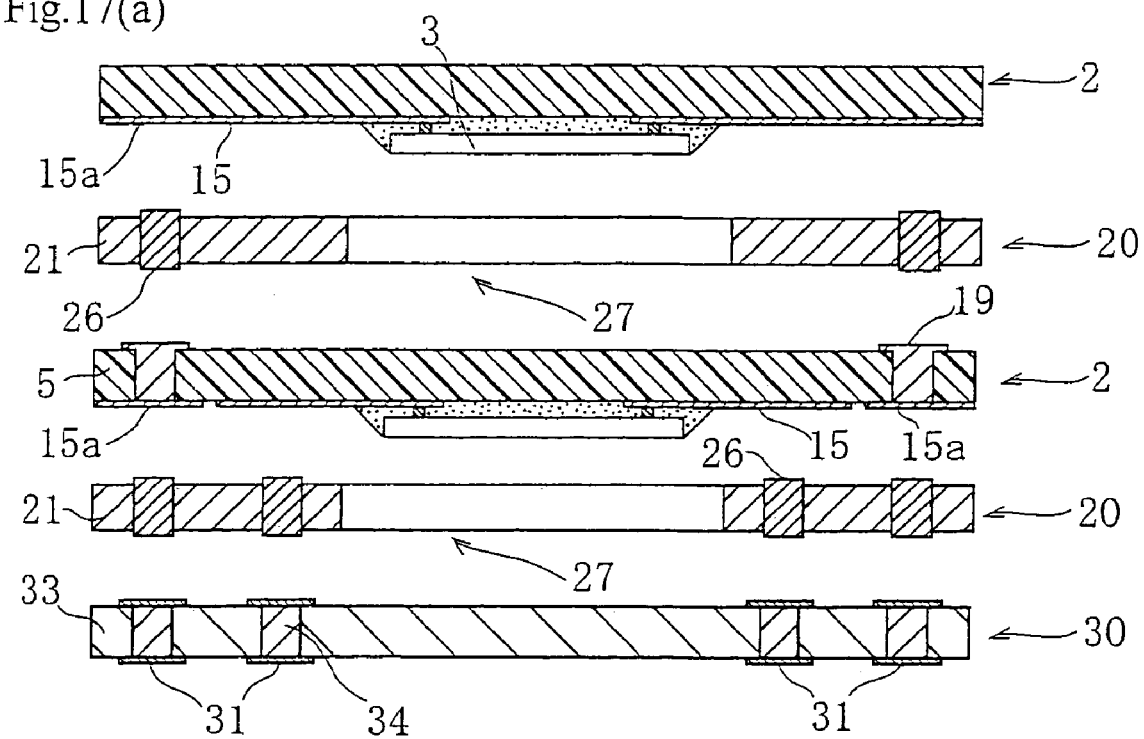
FIG. 17(a) is a perspective view of the semiconductor chip mounting wiring board according to the sixth embodiment of the present invention, interlayer member and I/O wiring board, stacked on each other.
Figure 17B:
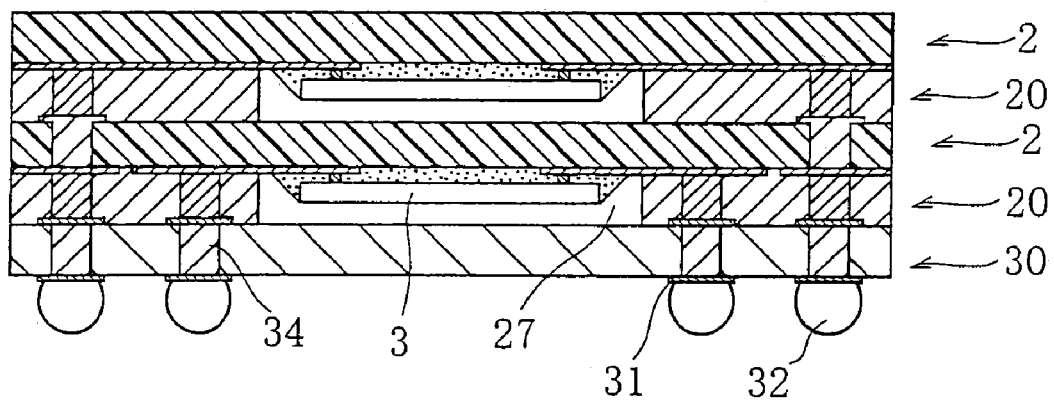
FIG. 17(b) is a sectional view of the semiconductor module produced by applying hot-pressing to the stack shown in FIG. 17(a).
Figure 18A:
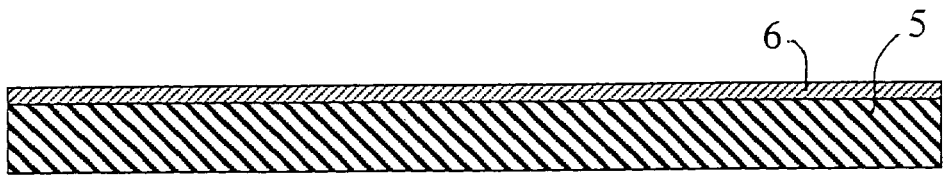
FIGS. 18(a) to 18(f) show a part of the process of producing the interlayer member used in a seventh embodiment of the present invention.
Figure 18B:
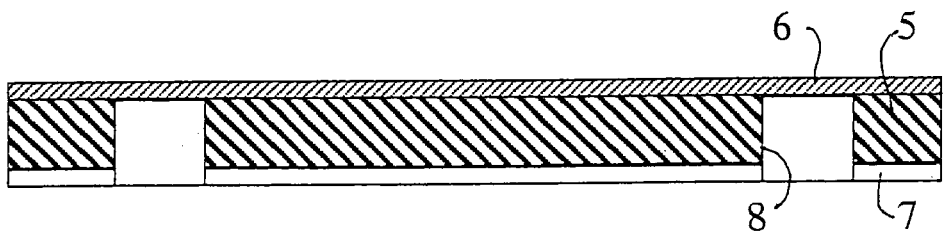
Figure 18C:
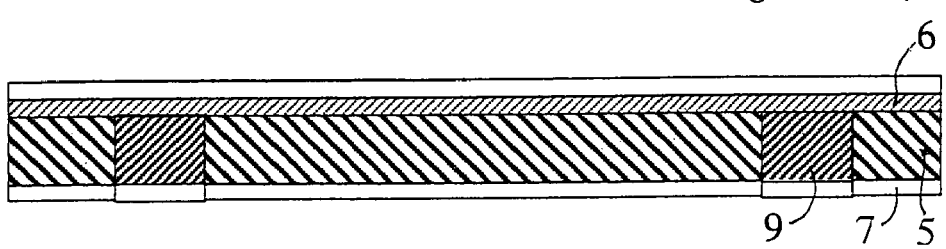
Figure 18D:
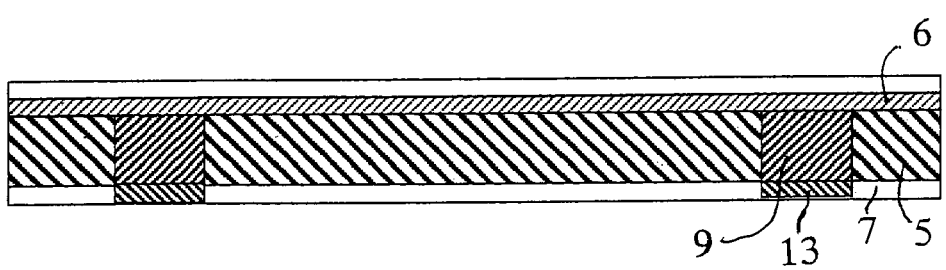
Figure 18E:
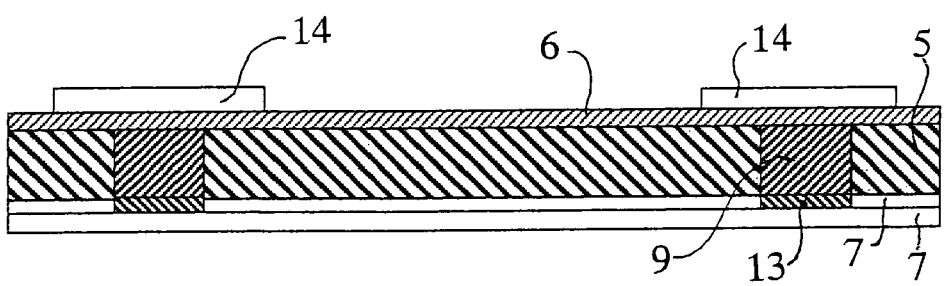
Figure 18F:
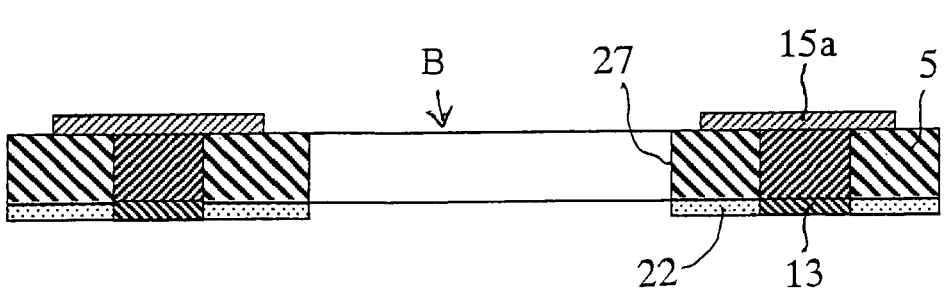

(9) Next, a glass fabric was impregnate with epoxy rein substrate, and heated to a semi-hardened state to form plate which was a prepreg of 130 μm in thickness, which was used as an insulating resin substrate 21 to form an interlayer member 20. Portions of the insulating resin substrate 20 were subjected to processes as in the steps (10) to (14) for the embodiment 1, except for the desmearing, to produce a semiconductor module 1 having the BGA structure (as shown in FIGS. 17(*a*) and 17(*b*)).

In the embodiment 6, the semiconductor chip mounting wiring board 2 has formed thereon conductive pads, that is, interconnecting lands 15*a* and 19, having a relatively large area of connection, to which the conductive posts 26 formed on the adjacent interlayer member 20 are connected, and the conductive posts 26 formed on the interlayer member 20 and having a relatively small area of connection are connected to the conductive pads 31 of the I/O wiring board 30. So, the wiring patterns on the stacked semiconductor chip mounting wiring boards 2 and those on the I/O wiring board 30 can be electrically connected positively to each other. Therefore, poor electrical connection can considerably be reduced and thus a semiconductor module high in connection reliability can be produced according to the present invention.

Embodiment 7

(1) Processes as in the steps (1) to (9) for production of the embodiment 1 were effected to prepare a semiconductor chip mounting wiring board A.

(2) Next, a glass fabric was impregnated with epoxy resin to prepare a B-stage prepreg. The prepreg and copper foil were applied with hot-pressing to form a one-side copper-clad laminate. The one-side copper-clad laminate was used as the stating material for the interlayer member 20. The insulating resin substrate 5 was 50 μm thick and the copper foil 6 was 18 μm thick (as shown in FIG. 18(*a*)).

(3) By conducting processes as in the steps (2) to (6) for the embodiment 1, a viahole 9 was formed in the insulating resin substrate 5, and a conductive bump 13 was formed on the viahole 9 (as shown in FIGS. 18(*b*) to 18(*d*)).

(4) Thereafter, a PET film 6 as an etching protective film was attached to the side of the insulating resin substrate 5 opposite to the side to which the copper foil 6 was attached, and in this condition, an etching photoresist layer 14 was formed on the copper foil 6 (as shown in FIG. 18(*e*)), the portions of the copper foil 6, not applied with the etching photoresist, were etched to form a wiring pattern 15 including an interconnecting land 15*a* formed on the viahole 9.

(5) The wiring pattern 15 was etched to form a matted layer (not shown), an adhesive layer 22 was formed on the side of the insulating resin substrate 5, on which the conductive bump 13 was formed, and then an opening 27 was formed nearly in the center of the insulating resin substrate 5. Thus, an interlayer member B was prepared.

Figure 19:
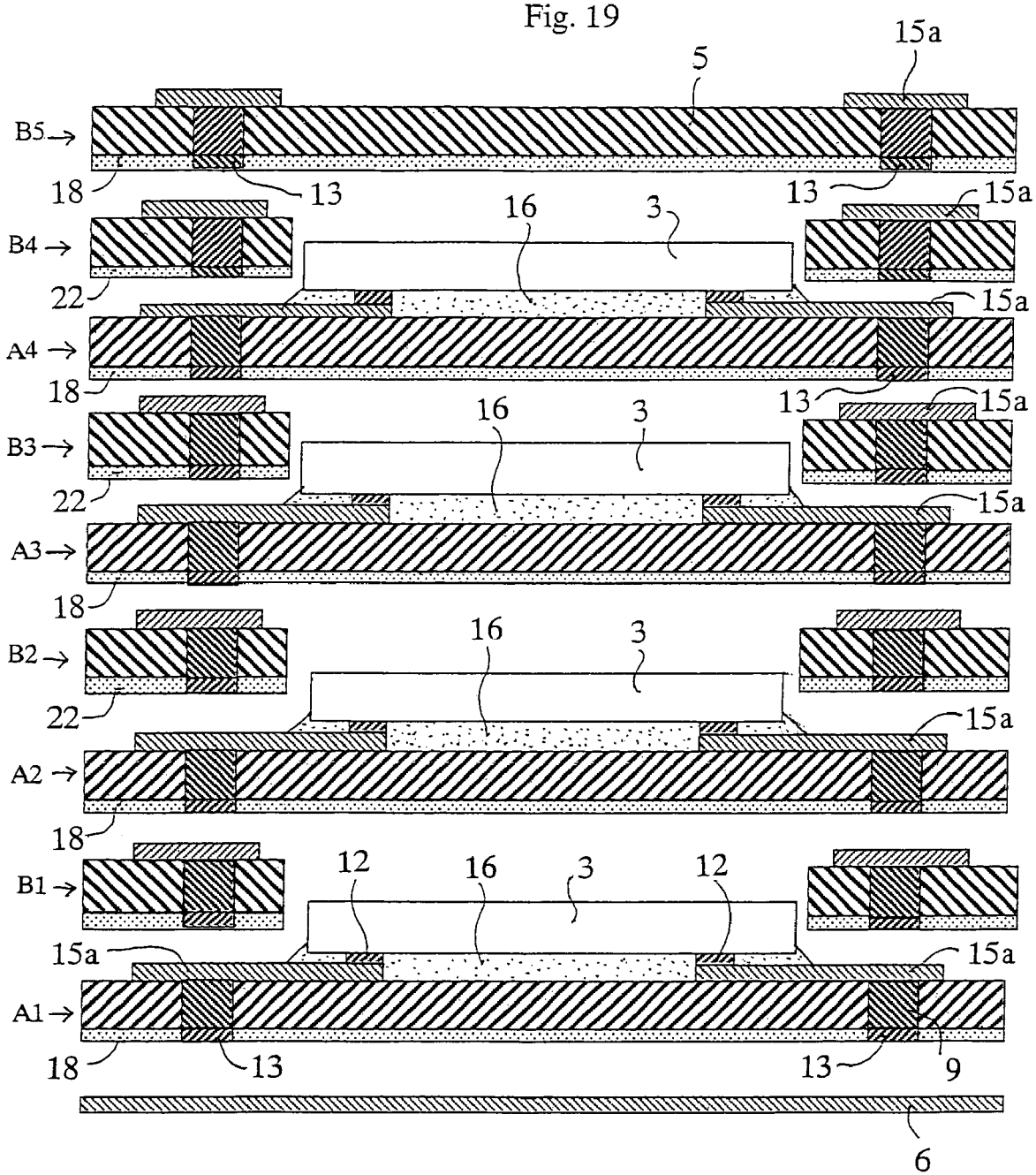
Figure 20:
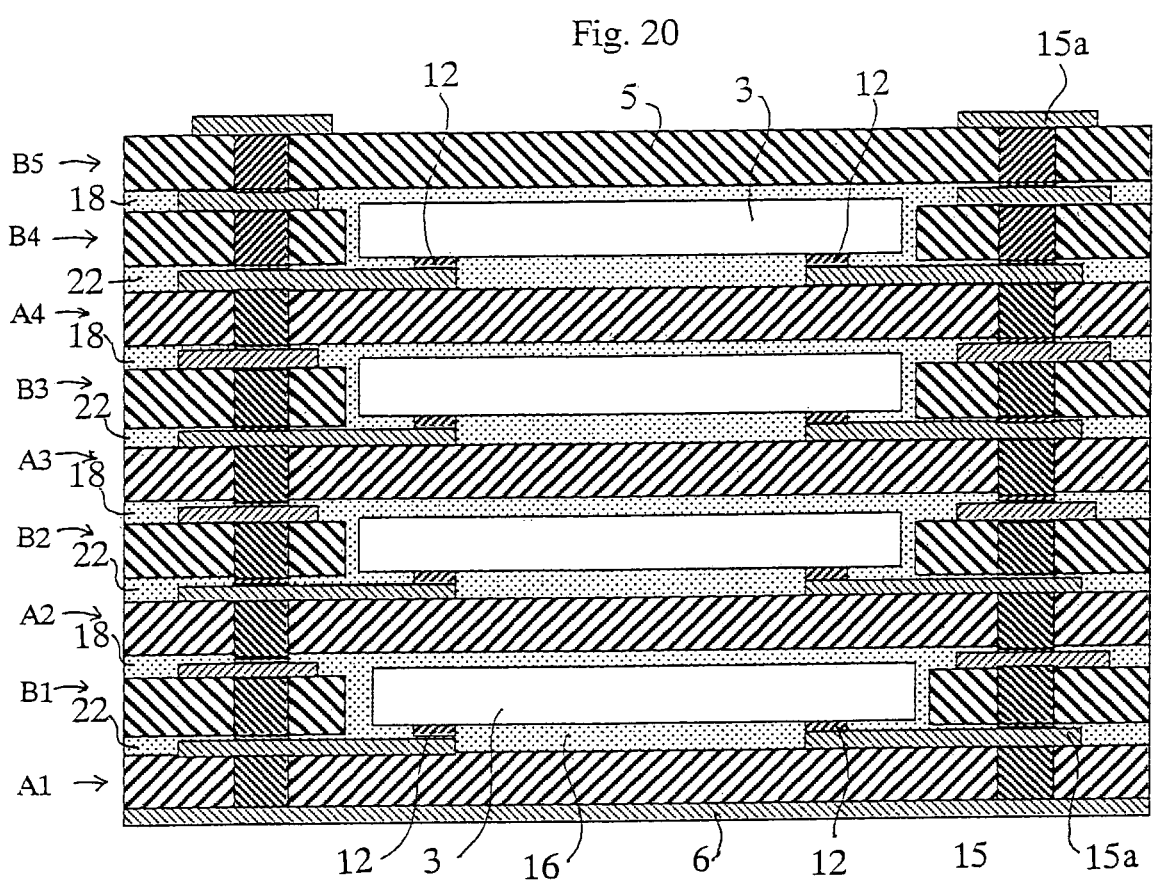
Figure 21:
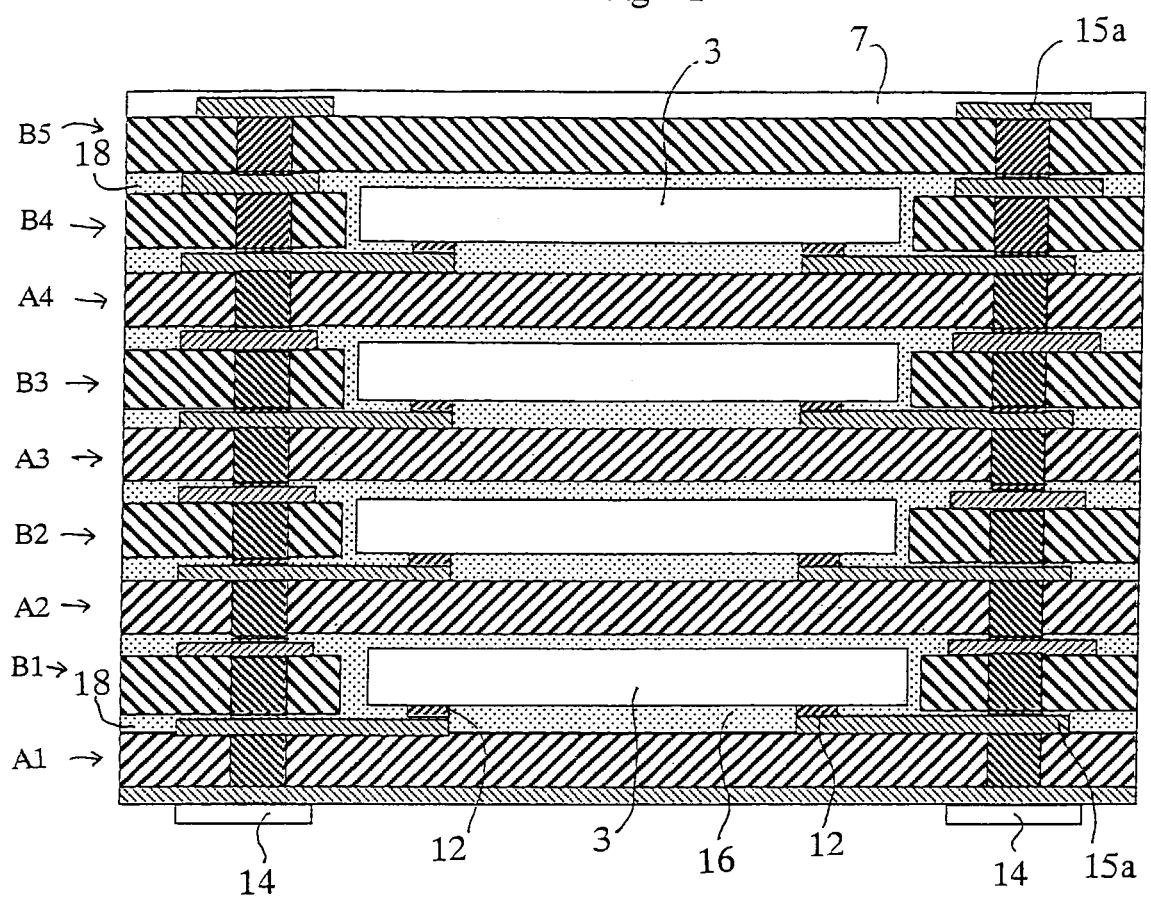

(6) Four mounting wiring boards A1 to A4 each having a semiconductor chip 3 mounted thereon and four interlayer members B1 to B4 were stacked alternately on one another. Another interlayer member B5 having no central opening formed therein was laid outside the interlayer member B4 as the uppermost layer, while a copper foil 6 was laid outside the mounting wiring board A1 as the lowermost layer (as shown in FIG. 19). There were heated at a temperature of 180° C. and pressed under a pressure of 2 MPa to integrate all these substrates by one press-molding (as shown in FIG. 20).

(7) A PET film 7 was attached as an etching protective film to the surface of the interlayer member B5 as the uppermost layer of the stack formed in the step (6) above, an etching photoresist layer 14 corresponding to a predetermined wiring pattern was formed on the copper foil on the mounting wiring board A1 as the lowermost layer, and etching was done to form a conductive pad 15*a*.

(8) Next, the PET film 7 was separated from the surface of the interlayer member B5 as the uppermost layer, the etching photoresist layer 14 was removed, a solder photoresist layer 54 having openings through which the solder pads 15*a* were exposed was formed on each of the surface of the interlayer member B5 as the uppermost layer and surface of the mounting wiring board A1 as the lowermost layer, and a conductive bump 50 and solder ball 52 were provided on the exposed solder pads 15*a*, respectively.

A metal layer of nickel and gold should preferably be formed on each solder pad. The nickel layer should be 1 to 7 μm thick and gold layer be 0.01 to 0.06 μm thick for the reasons that if the nickel layer is too thick, it will have an increased resistance while it will be likely to be separable if it is too thin and that if the gold layer is too thick, it will add to the costs while the adhesion to the solder ball will be smaller if it is too thin.

Solder was supplied to the nickel-gold layer provided on the solder pad 15*a*, melted and solidified to form a conductive bump 50 on the uppermost interlayer member B5 and a solder ball 52 on the lowermost mounting wiring board A1. Thus, a semiconductor module 1 was produced.

Embodiment 8

The semiconductor chip mounting wiring board 2 and semiconductor module 1 were produced by conducting processes similar to those for the embodiment 7 except that by printing with a conductive paste comprising a tin-silver solder whose melting point is low, there were formed the first conductive bump 12 of 80 µm in diameter 20 µm in height and 140 µm in inter-bump distance (pitch) and the second conductive bump 13 of 150 µm in diameter, 5 µm in height and 500 µm in inter-bump distance.

Embodiment 9

The semiconductor chip mounting wiring board 2 and semiconductor module 1 were produced by conducting processes as for the embodiment 1 except that the insulating resin substrate 5 was applied with electrolytic solder plating in an electrolytic plating solution whose composition was as follows under the following conditions to fill electrolytic solder into the opening 11 and thus form, on the copper foil 6, the first conductive bump 12 of 80 m in diameter, 20 in height and 140 µm in inter-bump distance (pitch).

Electrolytic Solder Plating Solution:

| Sn(BF4)2 | 25 g/l |
|---|---|
| Pb(BF4)2 | 12 g/l |
| Additive | 5 ml/l |

Electrolytic Solder Plating Conditions:

| Temperature | 20° C. |
|---|---|
| Current density | 0.4 A/dm$^2$ |

The semiconductor modules produced according to the aforementioned embodiments 1 to 9 were visually checked and tested for electrical continuity to examine the physical and electrical properties of them.

The test results show that the semiconductor modules had no problem in respects of the interlayer connection and adhesion, and showed no delamination and cracking at the IC chips and conductive connections up to 1000 heat-cycles and also no increased resistance at such portions.

INDUSTRIAL APPLICABILITY

As having been described in the foregoing, the mounting wiring boards each having a semiconductor chip securely mounted on the conductive bumps and the interlayer members each having formed therein an opening to receive the semiconductor chip therein, can be stacked alternately on one another to reduce the distance between the semiconductor chips and improve the electrical connection between them, minimize possible troubles due to wiring resistance and inductance, and thus transmit electric signals quickly without delay. Also, the present invention can provide a semiconductor module having a high connection reliability and which can be designed for a higher mounting density, more functionality and a lower profile.

What is claimed:

1. A semiconductor module comprising:
   semiconductor chip mounting wiring boards, at least one of the semiconductor chip mounting boards including an insulating resin substrate including a center and a periphery, and having provided nearly in the center on one side thereof a semiconductor chip mounting area, first conductive bumps formed in the semiconductor chip mounting area, openings in the insulating substrate outside the semiconductor chip mounting area, wiring patterns extending from the first conductive bumps over the openings toward the periphery of the insulating resin substrate, viaholes formed, on the other side of the insulating resin substrate, from a conductive substance filled in the openings leading to the wiring patterns, and second conductive bumps electrically connected to the viaholes and projecting from the other side of the insulating resin substrate; and interlayer members each formed from an insulating resin substrate including a center and having formed nearly in the center thereof an opening to receive the semiconductor chip, and a conductive post formed from a conductive substance filled in a through-hole formed through the insulating resin substrate of the interlayer members and projecting from either side of the insulating resin substrate of the interlayer members; and the semiconductor chip mounting wiring boards and the interlayer members are alternately stacked with an adhesive applied therebetween and the stack being hot-pressed.

2. The semiconductor module according to claim 1, wherein the semiconductor chip mounting wiring boards are formed from a rigid insulating resin substrate and the interlayer is members are formed from a rigid insulating resin substrate or unhardened prepreg.

3. The semiconductor module according to claim 1, wherein a part of the wiring patterns corresponding to the viahole is shaped in the form of a conductive pad.

4. The semiconductor module according to claim 3, wherein there is formed on the other side of the insulating resin substrate a wiring pattern electrically connected to the conductive pad.

5. The semiconductor module according to claim 1, wherein the viaholes are formed from at least a metal selected from Cu, Sn, Pb, Ag, Au, Zn, In, Bi, solder and tin alloy.

6. The semiconductor module according to claim 5, wherein the viaholes are formed from a metal containing at least a metal whose melting point is lower than that of copper.

7. The semiconductor module according to claim 6, wherein the viaholes are formed to have two layers, one being formed by applying a plating of electrolytic copper filled near the bottom of the opening for forming the viaholes and the other being formed by electrolytic plating of a metal whose melting point is lower than copper, filled near the top end of the opening.

8. The semiconductor module according to claim 5, wherein the viaholes are formed by electrolytic or electroless plating.

9. The semiconductor module according to claim 1, wherein the first conductive bumps and the second conductive bumps are formed from at least a metal selected from Cu, Sn, Pb, Ag, Au, Zn, In, Bi, solder and tin alloy and which is electroless-plated.

10. The semiconductor module according to claim 9, wherein the first conductive bumps and the second conductive bumps are formed by electrolytic or electroless plating.

11. The semiconductor module according to claim 1, wherein the first conductive bumps and the second conductive bumps are formed from metals of different melting points, respectively.

12. The semiconductor module according to claim 11, wherein the first conductive bumps are formed from a metal whose melting point is lower than that of a metal from which the second conductive bumps are formed.

13. The semiconductor module according to claim 12, wherein the melting points of the first conductive bumps and the second conductive bumps should desirably be within a range of 150 to 240° C.

14. The semiconductor module according to claim 1, wherein the adhesive is applied on the other side of the insulating resin substrate.

15. The semiconductor module according to claim 14, wherein the adhesive is at least one resin selected from epoxy resin, polyimide resin, thermo-setting polyphenylene ether, composite resin of epoxy resin and thermo-setting resin, composite resin of epoxy resin and silicone resin, and BT resin.

16. The semiconductor module according to claim 1, wherein the adhesive is formed on at least one side of the interlayer members.

17. The semiconductor module according to claim 1, wherein a matted layer is formed on a surface of the wiring patterns.

18. The semiconductor module according to claim 1, wherein the through-hole formed in the interlayer members is shaped in the general form of a truncated cone, and thus the conductive post projecting from the through-hole is shaped so that the diameter at one end thereof is smaller than that at the other end.

19. The semiconductor module according to claim 1, wherein the through-hole formed in the interlayer members is shaped to have such a form that a small-diameter cylinder is coaxially-joined to a large-diameter cylinder, and the conductive post projecting from the through-hole is shaped so that the diameter at one end thereof is smaller than that at the other end.

20. The semiconductor module according to claim 18, wherein the ratio of the diameter at one end of the conductive post to that at the other end is 1:2 to 1:3.

21. A semiconductor module comprising:
semiconductor chip mounting wiring boards, at least one of the semiconductor chip mounting boards including an insulating resin substrate including a center and a periphery, and having provided nearly in the center on one side thereof a semiconductor chip mounting area, first conductive bumps formed in the semiconductor chip mounting area, openings in the insulating substrate outside the semiconductor chip mounting area, wiring patterns extending from the first conductive bumps over the openings toward the periphery of the insulating resin substrate, viaholes formed, on the other side of the insulating resin substrate, from a conductive substance filled in the openings leading to the wiring patterns, and conductive pads electrically connected to the viaholes and projecting from the other side of the insulating resin substrate; and interlayer members each formed from an insulating resin substrate including a center and having formed nearly in the center thereof an opening to receive the semiconductor chip, and a conductive post formed from a conductive substance filled in a through-hole formed through the insulating resin substrate of the interlayer members and projecting from either side of the insulating resin substrate of the interlayer members; and the semiconductor chip mounting wiring boards and the interlayer members are alternately stacked with an adhesive layer applied therebetween and the stack being hot-pressed.

22. A semiconductor module comprising:
semiconductor chip mounting wiring boards, at least one of the semiconductor chip mounting boards including an insulating resin substrate including a center and a periphery, and having provided nearly in the center on one side thereof a semiconductor chip mounting area, first conductive bumps formed in the semiconductor chip mounting area, openings in the insulating substrate outside the semiconductor chip mounting area, wiring patterns extending from the first conductive bumps over the openings toward the periphery of the insulating resin substrate, viaholes formed, on the other side of the insulating resin substrate, from a conductive substance filled in the openings leading to the wiring patterns, and second conductive bumps electrically connected to the viaholes and projecting from the other side of the insulating resin substrate; and interlayer members each formed from an insulating resin substrate including a center and having formed nearly in the center on one side thereof an opening to receive the semiconductor chip, a predetermined wiring pattern formed at the periphery of the insulating resin substrate, a viahole formed from a conductive substance filled in an opening leading from the other side of the insulative resin substrate to the wiring pattern, and a conductive bump formed just above the viahole; and the semiconductor chip mounting wiring boards and the interlayer members are alternately stacked with an adhesive applied therebetween and the stack being hot-pressed.

* * * * *

UNITED STATES PATENT AND TRADEMARK OFFICE
CERTIFICATE OF CORRECTION

PATENT NO. : 7,656,032 B2  Page 1 of 1
APPLICATION NO. : 11/280248
DATED : February 2, 2010
INVENTOR(S) : T. Kariya et al.

It is certified that error appears in the above-identified patent and that said Letters Patent is hereby corrected as shown below:

At column 38, line 26 (claim 2, line 4) of the printed patent, delete "is" before members.

Signed and Sealed this

Twenty-first Day of September, 2010

David J. Kappos
*Director of the United States Patent and Trademark Office*